US010395594B1

(12) United States Patent
Charisoulis et al.

(10) Patent No.: US 10,395,594 B1
(45) Date of Patent: *Aug. 27, 2019

(54) HYBRID MICRODRIVER AND TFT ARCHITECTURE

(71) Applicant: Apple Inc., Cupertino, CA (US)

(72) Inventors: Thomas Charisoulis, Mountain View, CA (US); Tore Nauta, Santa Cruz, CA (US); Kapil Sakariya, Los Altos, CA (US); Jean-Jacques P. Drolet, San Jose, CA (US)

(73) Assignee: Apple Inc., Cupertino, CA (US)

( * ) Notice: Subject to any disclaimer, the term of this patent is extended or adjusted under 35 U.S.C. 154(b) by 259 days.

This patent is subject to a terminal disclaimer.

(21) Appl. No.: 15/247,661

(22) Filed: Aug. 25, 2016

Related U.S. Application Data

(60) Provisional application No. 62/220,851, filed on Sep. 18, 2015.

(51) Int. Cl.
*G09G 3/3241* (2016.01)
*G09G 3/20* (2006.01)
(Continued)

(52) U.S. Cl.
CPC ......... *G09G 3/3241* (2013.01); *G09G 3/2018* (2013.01); *G09G 3/2074* (2013.01); *G09G 3/3258* (2013.01); *G09G 3/3275* (2013.01); *G09G 2300/0426* (2013.01); *G09G 2300/0452* (2013.01); *G09G 2310/027* (2013.01); *G09G 2310/0291* (2013.01); *G09G 2310/08* (2013.01); *G09G 2320/064* (2013.01); *G09G 2330/021* (2013.01); *H01L 25/167* (2013.01); *H01L 27/1225* (2013.01); *H01L 27/3251* (2013.01); *H01L 27/3262* (2013.01);
(Continued)

(58) Field of Classification Search
CPC ... G09G 3/3275; G09G 3/2014; G09G 3/3233
See application file for complete search history.

(56) References Cited

U.S. PATENT DOCUMENTS

| 2005/0067968 | A1* | 3/2005 | Yamashita | ........... G09G 3/3258 315/167 |
| 2006/0007249 | A1 | 1/2006 | Reddy | |

(Continued)

*Primary Examiner* — Abbas I Abdulselam
(74) *Attorney, Agent, or Firm* — Jaffery Watson Mendonsa & Hamilton LLP

(57) ABSTRACT

Methods, systems, and apparatuses for controlling an emission of the light emitting devices are described herein. The light emitting devices may be light emitting diode (LED) devices including μLED devices or organic LED (OLED) devices. Emission control of the LED may be performed using a micro-scale driving circuit (e.g., μDriver) containing drive transistors for constant current driving of the light emitting devices. One embodiment provides for a display driver hardware circuit including emission logic, the emission logic including comparator logic to compare a data voltage from a storage capacitor to a voltage ramp provided via the TFT backplane, the comparator logic to cause the emission logic to generate an emission pulse to an LED device, and wherein the integrated circuit is to switch and drive a plurality of LED devices. In one embodiment each of the plurality of LED devices is a subpixel for a display device.

29 Claims, 18 Drawing Sheets

(51) Int. Cl.
  *G09G 3/3275* (2016.01)
  *G09G 3/3258* (2016.01)
  *H01L 29/786* (2006.01)
  *H01L 27/12* (2006.01)
  *H01L 27/32* (2006.01)
  *H01L 25/16* (2006.01)

(52) U.S. Cl.
  CPC .... *H01L 29/7869* (2013.01); *H01L 29/78654* (2013.01); *H01L 29/78672* (2013.01)

(56) References Cited

U.S. PATENT DOCUMENTS

| | | | |
|---|---|---|---|
| 2006/0050031 A1 | 3/2006 | Suzuki | |
| 2008/0055289 A1 | 3/2008 | Kim | |
| 2008/0224975 A1* | 9/2008 | Lee | G09G 3/3648 |
| | | | 345/89 |
| 2009/0167649 A1* | 7/2009 | Ishizuka | G09G 3/3258 |
| | | | 345/80 |
| 2010/0045650 A1 | 2/2010 | Fish | |
| 2011/0025671 A1 | 2/2011 | Lee | |
| 2012/0105498 A1* | 5/2012 | Kim | G09G 3/3426 |
| | | | 345/690 |
| 2013/0241438 A1* | 9/2013 | Suzuki | H02J 1/00 |
| | | | 315/295 |
| 2013/0319992 A1* | 12/2013 | Meusburger | F24C 15/008 |
| | | | 219/220 |
| 2014/0168037 A1* | 6/2014 | Sakariya | G09G 3/3233 |
| | | | 345/82 |
| 2014/0346473 A1* | 11/2014 | Park | H01L 51/5256 |
| | | | 257/40 |
| 2016/0163265 A1* | 6/2016 | Yang | G09G 3/3233 |
| | | | 345/690 |
| 2016/0181346 A1* | 6/2016 | Kwon | H01L 27/3276 |
| | | | 257/40 |
| 2018/0211940 A1* | 7/2018 | Henry | H01L 27/156 |

* cited by examiner

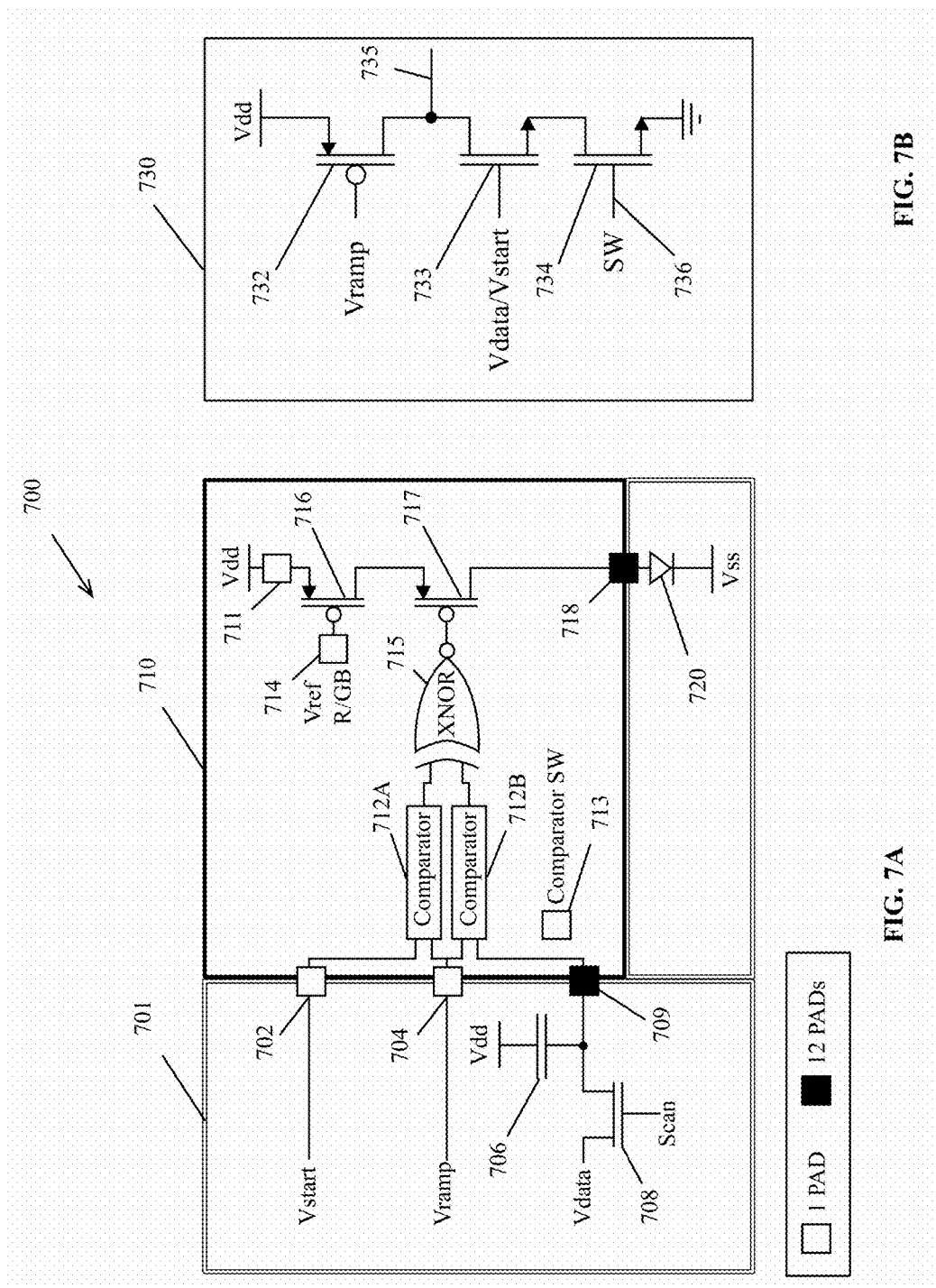

HYBRID MICRODRIVER AND TFT ARCHITECTURE

CROSS-REFERENCE

This application is a non-provisional application claiming the benefit of U.S. Provisional Application No. 62/220,851 filed on Sep. 18, 2015, which is hereby incorporated herein by reference.

FIELD

The disclosure relates generally to a display system, and, more specifically, to display driving circuitry for LED displays.

BACKGROUND OF THE DISCLOSURE

Display panels are utilized in a wide range of electronic devices. Common types of display panels include active matrix display panels where each pixel may be driven to display a data frame. High-resolution color display panels, such as computer displays, smart phones, and televisions, may use an active matrix display structure. An active matrix display of m×n display (e.g., pixel) elements may be addressed with m row lines and n column lines or a subset thereof. In conventional active matrix display technologies a switching device and storage device is located at every display element of the display. A display element may be a light emitting diode (LED) or other light emitting material. A storage device(s) (e.g., a capacitor or a data register) may be connected to each display (e.g., pixel) element, for example, to load a data signal therein (e.g., corresponding to the emission to be emitted from that display element). The switches in conventional displays are usually implemented through transistors made of deposited thin films, and thus are called thin film transistors (TFTs). A common semiconductor used for TFT integration is amorphous silicon (a-Si), which allows for large-area fabrication in a low temperature process. A main difference between a-Si TFT and a conventional silicon metal-oxide-semiconductor-field-effect-transistor (MOSFET) is lower electron mobility in a-Si due to the presence of electron traps. Another difference includes a larger threshold voltage shift. Low temperature polysilicon (LTPS) represents an alternative material that is used for TFT integration. LTPS TFTs have mobility that is higher than a-Si TFTs, yet lower than MOSFETs.

SUMMARY OF THE DESCRIPTION

Methods, systems, and apparatuses for controlling an emission of the light emitting devices are described herein. The light emitting devices may be light emitting diode (LED) devices including μLED devices or organic LED (OLED) devices. Emission control of the LED may be performed using a micro-scale driving circuit (e.g., μDriver) containing drive transistors for constant current driving of the light emitting devices.

One embodiment provides for a display driver hardware circuit including emission logic, the emission logic including comparator logic to compare a data voltage from a storage capacitor to a voltage ramp provided via the TFT backplane, the comparator logic to cause the emission logic to generate an emission pulse on an LED device, and wherein the integrated circuit is to switch and drive a plurality of LED devices. In one embodiment each of the plurality of LED devices is a subpixel for a display device. In one embodiment the emission logic is to supply a constant current to the LED device, the constant current based on an adjustable reference voltage and is configured to terminate current to the LED device to end the emission pulse based on output of the comparator logic.

In one embodiment the TFT backplane includes a low temperature poly-silicon (LTPS) transistor. In one embodiment the TFT backplane includes an Indium Gallium Zinc Oxide (IGZO) transistor. In one embodiment the comparator logic includes a current comparator coupled to the voltage ramp provided by the TFT backplane. In one embodiment the comparator logic comprises a transistor coupled to the storage capacitor. In one embodiment the integrated circuit is comprised of crystalline silicon and has a maximum lateral dimension of 1 to 100 μm. In one embodiment the integrated circuit has a maximum lateral dimension of 50 μm.

One embodiment provides fort a display driver hardware circuit comprising a thin film transistor (TFT) backplane, an integrated circuit including emission logic to cause an LED emission pulse, where the LED emission pulse is adjustable from a continuous duty cycle to a non-continuous duty cycle, the integrated circuit is a crystalline silicon integrated circuit coupled a ramp signal generator to cause a voltage ramp having a slope based on an analog input voltage from the TFT backplane, wherein a length of the LED emission pulse is related to the slope of the voltage ramp. The integrated circuit can additionally include comparator logic to control the emission logic during the LED emission pulse. The comparator logic can include a transistor coupled between a data voltage and a ramp voltage. The comparator logic can be configured to end the LED emission pulse when the ramp voltage is within a threshold of the data voltage. The ramp signal generator can be included in a row driver coupled to the display driver hardware circuit or a timing control circuit coupled to the display driver hardware circuit.

One embodiment provides for a light emitting assembly comprising an array of light emitting diode (LED) devices, a sample and hold circuit including a thin film transistor (TFT), a ramp signal generator, and an array of microcontrollers to switch and drive the array of LED devices based on a voltage ramp caused by the ramp signal generator, the voltage ramp to determine a pulse length of an emission pulse to an LED device of the array of LED devices. In one embodiment a number of microcontrollers in the array of microcontrollers is less than a number of LED devices in the array of LED devices and each microcontroller in the array of microcontrollers is in electrical connection with a plurality of pixels to drive a plurality of LED devices in each pixel. In one embodiment each LED device in the array of LED devices has a maximum lateral dimension of 1 to 100 μm. In one embodiment at least one microcontroller in the array of microcontrollers has maximum lateral dimension of 1 to 100 μm. In one embodiment at least one microcontroller in the array of microcontrollers has maximum lateral dimension of 50 μm.

One embodiment provides for a display system comprising a backplane including an active area, an array of micro driver chips in the active area, an array of micro light emitting diode (LED) devices in the active area, the array of micro LED devices electrically connected to the array of micro driver chips, and each micro driver chip controls a plurality of pixels. The backplane can additionally include an emission controller to cause the array of micro driver chips to supply an emission pulse to the array of LED devices, wherein a length of the emission pulse is a function of an analog input data voltage. In one embodiment the display system additionally comprises a row of column drivers including a plurality of column drivers and a column of row drivers including a plurality of row drivers and/or a length of the emission pulse is proportional to a value of the analog input data voltage. In one embodiment the backplane is a TFT backplane and the array of micro driver chips comprises an array of crystalline silicon integrated circuits to switch and drive the array of micro LED devices. The backplane can include a low temperature poly-silicon (LTPS) transistor and/or an Indium Gallium Zinc Oxide (IGZO) transistor.

BRIEF DESCRIPTION OF THE DRAWINGS

Embodiments are illustrated by way of example and not limitation in the Figures of the accompanying drawings:

FIGS. 7A-B show circuit diagrams for a hybrid analog PWM μLED Driving Circuit that uses a current comparator and an XOR gate as current control logic

DETAILED DESCRIPTION

Figure 1:
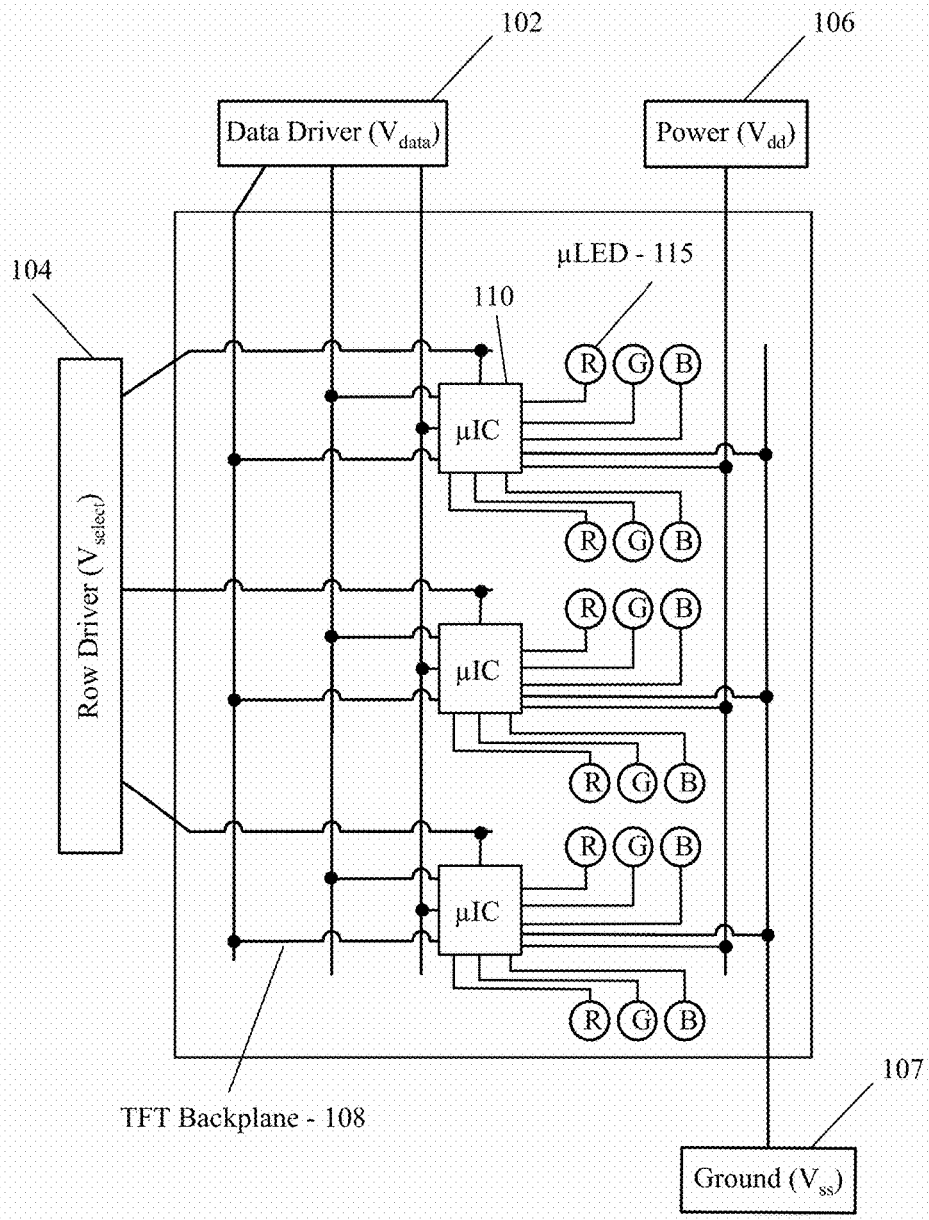
FIG. 1 is a block diagram of hybrid micro-driver display architecture, according to an embodiment.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known techniques and components have not been described in particular detail in order to not unnecessarily obscure the present disclosure. Additionally, concepts described in detail in some figures are not described in detail in other figures. For the sake of brevity of description, the description of identical features that are identified by identical numerals may not be repeated throughout the description.

Reference throughout this specification to "one embodiment," "an embodiment", or the like means that a particular feature, structure, configuration, or characteristic described in connection with the embodiment is included in at least one embodiment of the disclosure. Thus, the appearances of the phrase "in one embodiment," "in an embodiment", or the like in various places throughout this specification are not necessarily referring to the same embodiment of the disclosure. Furthermore, the particular features, structures, configurations, or characteristics may be combined in any suitable manner in one or more embodiments.

The terms "over," "to," "between," and "on" as used herein may refer to a relative position of one layer with respect to other layers. One layer "over," or "on" another layer or bonded "to" another layer may be directly in contact with the other layer or may have one or more intervening layers. One layer "between" layers may be directly in contact with the layers or may have one or more intervening layers.

The term "ON" as used in this specification in connection with a device state refers to an activated state of the device, and the term "OFF" refers to a de-activated state of the device. The term "ON" as used herein in connection with a signal received by a device refers to a signal that activates the device, and the term "OFF" used in this connection refers to a signal that de-activates the device. A device may be activated by a high voltage or a low voltage, depending on the underlying electronics implementing the device. For example, a PMOS transistor device is activated by a low voltage while a NMOS transistor device is activated by a high voltage. Thus, it should be understood that an "ON" voltage for a PMOS transistor device and a NMOS transistor device correspond to opposite (low vs. high) voltage levels. It is also to be understood that where Vdd and Vss is illustrated or described, it can also indicate one or more Vdd and/or Vss. For example, a digital Vdd for can be used for data input, digital logic, memory devices, etc., while another Vdd is used for driving the LED output block.

In accordance with some embodiments, a hybrid LED driving circuit is described which is a hybrid arrangement of microdriver (also referred to as μD or μDriver) chips and a TFT substrate which, in combination, are used to driver a set of light emitting devices such as, but not limited to micro LEDs (also referred to as μLEDs). In an embodiment, a micro LED may be a semiconductor-based material having a maximum lateral dimension of 1 to 300 μm, 1 to 100 μm, 1 to 20 μm, or more specifically 1 to 10 μm, such as 5 μm. The light emitting devices may also be organic LEDs (OLEDs).

The hybrid LED driving circuit can use a hybrid of analog and digital driving techniques, in which an analog input voltage is used to control a digital pulse-width-modulation (PWM) driving scheme and may include a set of microdriver (e.g., μDriver) chips, which are integrated circuits containing emission logic to drive the LED devices. A μDriver chip may have a maximum lateral dimension of 1 to 100 μm, and may fit within the pixel layout of the micro LEDs. In accordance with embodiments, the μDriver chips can replace the LED drive transistors for each display element, which are commonly employed as TFT components. The μDriver chips may include digital unit cells, analog unit cells, or hybrid digital and analog unit cells. Additionally, MOSFET processing techniques may be used for fabrication of the μDriver chips on single crystalline silicon, in conjunction with TFT processing techniques on a-Si or LTPS.

The hybrid TFT and μDriver circuit can realize the benefits of μDriver circuit technology while reducing the overall size and number of inputs for each μDriver integrated circuit. The hybrid circuit includes a portion of the transistors and capacitors in a TFT layer while including an additional portion of LED switching and driving components in the μDriver integrated circuit, resulting in a reduced size and manufacturing cost of each μDriver circuit relative to including all switching and driving components in the μDriver. This hybrid approach combines traditional analog data driving with digital, constant current emission pulse width modulation (PWM), where the length of the emission pulse is a function of analog data voltage. The use of analog data driving allows the use of traditional SCAN and DATA lines coupled to a TFT substrate, where switching transistors and capacitors on the TFT substrate provide an analog input voltage to the μDriver circuit.

Hybrid TFT Micro-Driver Integrated Circuit Display Architecture and Overview

FIG. 1 is a block diagram of a hybrid micro-driver display architecture 100, according to an embodiment. In one embodiment, the hybrid μDriver display architecture 100 includes a data driver (Vdata) 102, a row driver (Vselect) 104 inputs to control the display, as well as power (Vdd) 106, and ground (Vss) inputs 107. A μDriver integrated circuit (IC) 110 and one or more μLEDs 115 are placed on a TFT backplane 108 including switching transistors and capacitors to supply data to the μDriver IC 110.

The μDriver IC 110 includes drive transistors for the one or more μLEDs 115 and can be fabricated separately from the TFT backplane 108 in a crystalline silicon wafer. The μDriver IC 110 can be placed directly onto any active or passive TFT backplane and can interface with any type of LED, including organic LEDs (OLED). The μDriver IC 110 can include a combination of any of the available CMOS types required for implementing the driver (such as CMOS, all NMOS or all PMOS).

In this figure, and in the figures to follow, each illustrated LED device (e.g., μLED 115) may represent a single LED device, or may represent multiple LED devices arranged in series, in parallel, or a combination of series and parallel. The LED devices can couple to a common ground or may each have a separate ground connection. The exemplary hybrid microdriver display architecture 100 illustrated shows three control inputs and six LED outputs, but embodiments are not so limited. A single μDriver IC 110 can control multiple lighting emitting devices, where each lighting devices has a separate analog input into the μDriver IC 110.

In one embodiment, the μDriver IC 110 couples with one or more red, green, and blue LED devices 115 that emit different colors of light. In a red-green-blue (RGB) sub-pixel arrangement, each pixel includes three sub-pixels that emit red, green and blue lights, respectively. The RGB arrangement is exemplary and that embodiments are not so limited. Additional sub-pixel arrangements include, red-green-blue-yellow (RGBY), red-green-blue-yellow-cyan (RGBYC), or red-green-blue-white (RGBW), or other sub-pixel matrix schemes where the pixels may have a different number of sub-pixels, such as the displays manufactured under the trademark name PenTile®.

In one embodiment, the smart-pixel micro-matrix is used in LED lighting solutions, or as an LED backlight for an LCD device. When used as a light source, blue or UV LEDs in combination with a yellow or blue-yellow phosphor may be used to provide a white backlight for LCD displays. In one embodiment, a smart-pixel micro-matrix using one or more blue LED devices, such as an indium gallium nitride (InGaN) LED device, is combined with the yellow luminescence from cerium doped yttrium aluminum garnet (YAG:Ce3+) phosphor. In one embodiment, red, green, and blue phosphors are combined with a near-ultraviolet/ultraviolet (nUV/UV) InGaN LED device to produce white light. The phosphor can be bonded to the surface of the LED device, or a remote phosphor can be used. In addition to white light emission, additional red, green and/or blue LED device can also be used to provide a wider color gamut than otherwise possible with white backlights.

In one embodiment, each sub-pixel circuit driver in the μDriver IC 110 is responsible for providing operating current for illumination to each individual LED. Thus, the circuitry for each sub-pixel circuit can be designed specifically for each LED, allowing the switching transistors in the backplane to be implemented by any combination of LTPS (Low Temperature Poly Silicon) and/or Oxide (e.g., IGZO or Indium Gallium Zinc Oxide) TFTs to ensure low leakage devices, while the technology of the μDriver IC 110 is independent of the backplane. The independent backplane and μDriver IC 110 enable the production of low voltage devices having higher mobilities. The higher mobilities of the driving circuit devices provide higher currents to the LEDs, resulting in reduced maximum rail voltages for reduced power consumption while maintaining minimum geometry transistors. The smaller geometry transistors enable the circuit to operate at higher speeds with lower parasitic losses, as the circuit occupies a smaller area. The size of the μDriver IC 110, in one embodiment is 50 μm wide by 24 μm long. However, the size of each μDriver IC 110 generally depends on the number of sub-pixel circuit drivers the μDriver IC 110 contains.

Figure 2A:
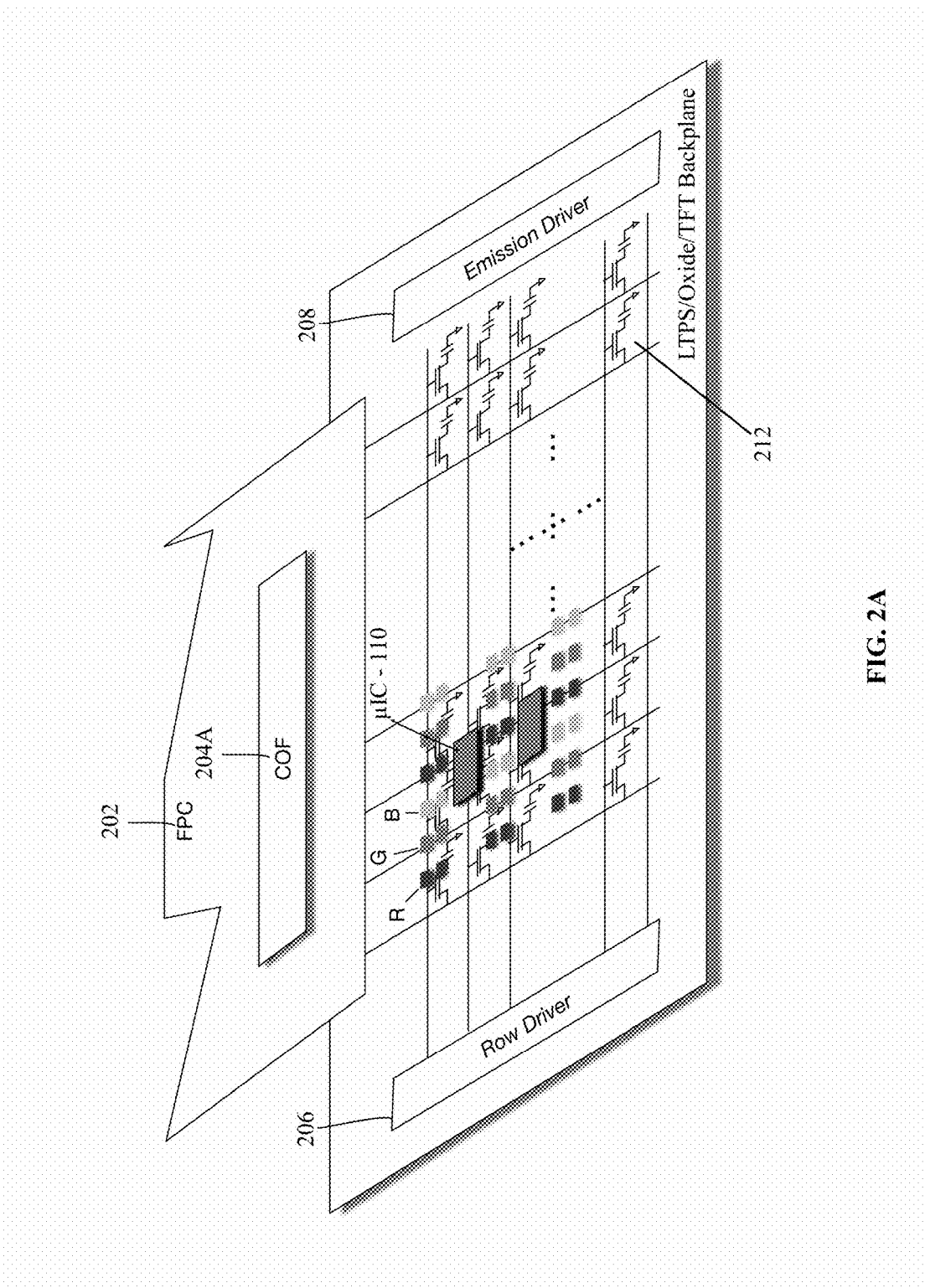
FIGS. 2A-B are block diagrams illustrating different views of an additional backplane-driver design, according to an embodiment.
Figure 2B:
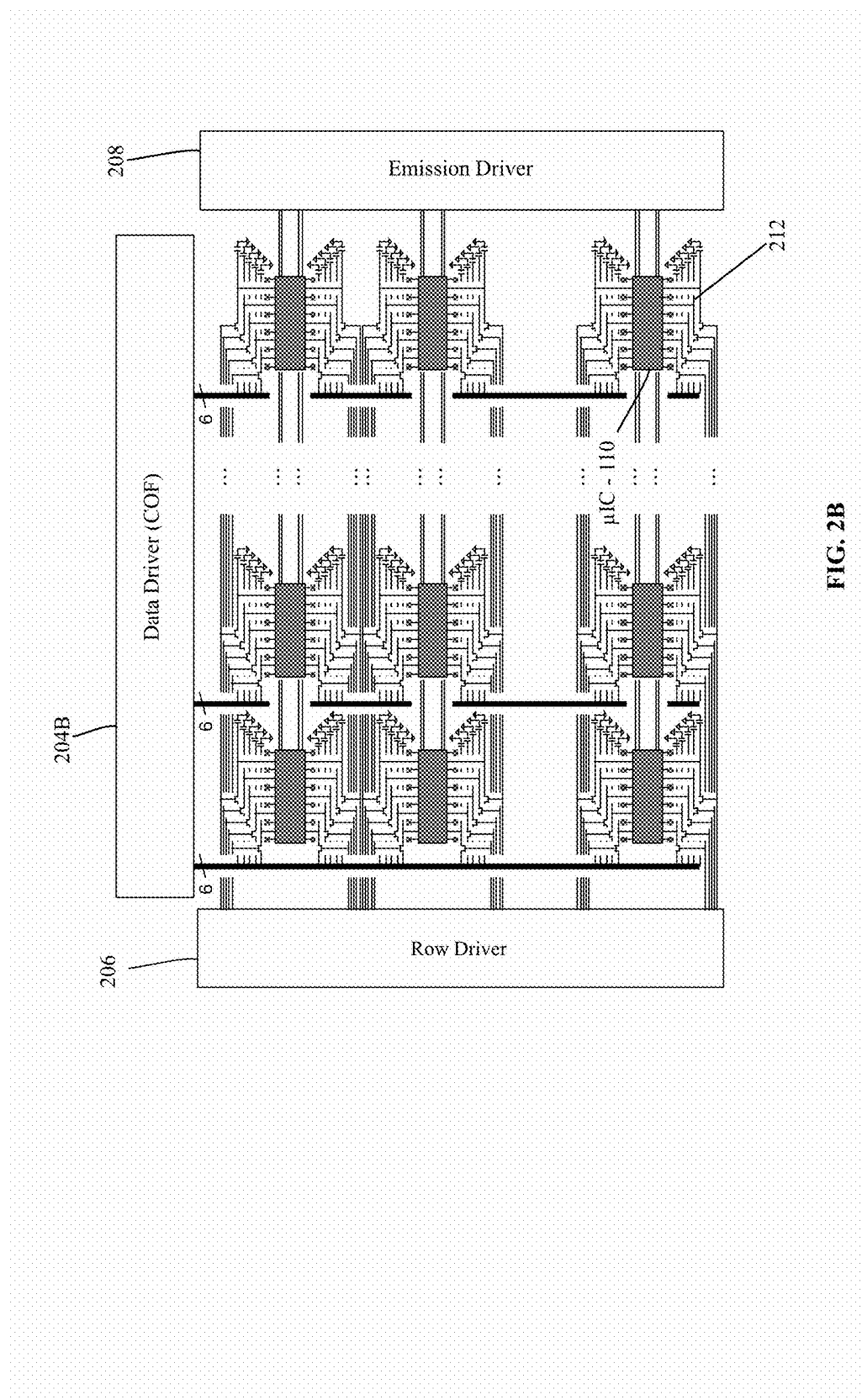

FIGS. 2A-B are block diagrams illustrating different views of an additional backplane-driver design, according to an embodiment. FIG. 2A illustrates an exemplary backplane driver design having a flexible printed circuit (FPC) and a chip on flex (COF) circuit. FIG. 2B illustrates a top-down view of the exemplary backplane driver design.

As illustrated in FIG. 2A, the backplane-driver design includes an FPC 202 coupled to an LTPS/Oxide TFT backplane 212. The FPC 202 can include a COF circuit 204A, which is an integrated circuit coupled to the FPC 202. In one embodiment a row driver 206 and an emission driver 208 couple to a TFT backplane 212, which may be an LTPS/Oxide TFT backplane. The TFT backplane 212 includes a sample and hold circuit having at least one transistor and one capacitor, although other sample and hold circuits may be used. A μDriver IC 110 couples to the TFT backplane 212 and a set of one or more light emitting devices (e.g., R, G, and B LEDs), where multiple light emitting devices can couple to a single μDriver IC 110.

FIG. 2B illustrates a top-down view of the exemplary backplane driver design, where a the row driver 206 and emission driver 208 are illustrated as coupled to the TFT backplane 212 in conjunction with a data driver 204B, which may be included in the COF circuit 204A shown in FIG. 2A. In one embodiment, the data driver 204B supplies pixel data values before the lighting elements are signaled for emission by the emission driver 208. The pixel data values are stored in capacitors selected by the row driver 206. After each line has been programmed with data, the emission driver 208 is responsible for sending the input to cause the illumination of the lighting elements for a pixel. In the illustrated display architecture, the data driver 204B controls the gray levels of the pixels and the emission driver 208 controls the brightness.

While the backplane driver architecture illustrated uses an active TFT matrix, in one embodiment, a passive matrix is employed, for example, when operational frequencies exceed the operational limits of the TFT backplane due to the low mobilities inherent in some TFT technologies. In a passive TFT matrix architecture, row and emission driving can be realized a chain of μDriver ICs 110 interconnected over a passive TFT backplane.

Figure 3:
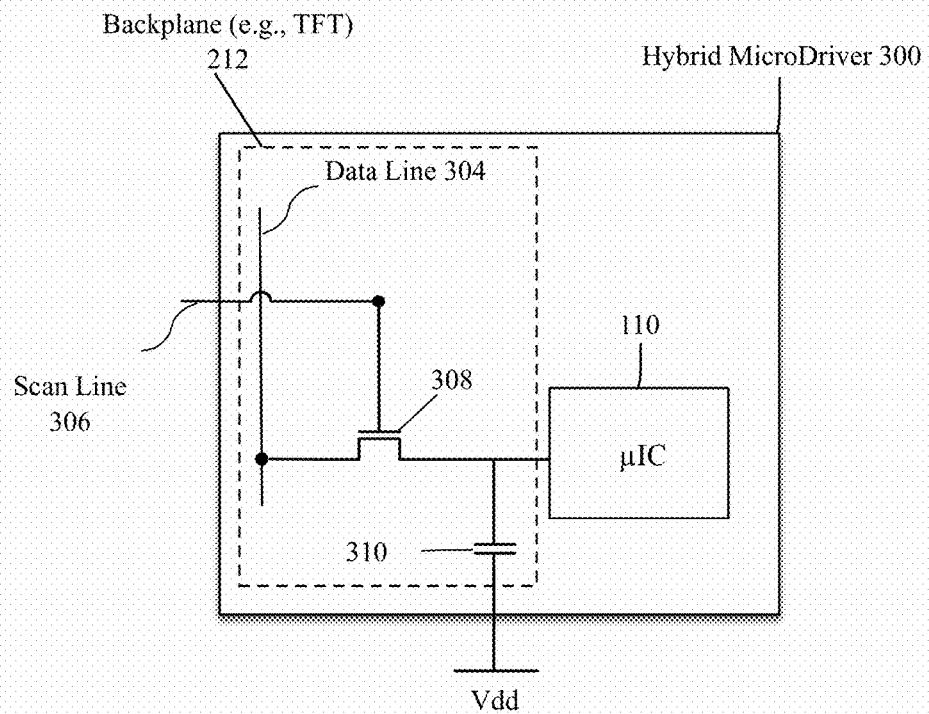
FIG. 3 is a block diagram of a basic circuit for a hybrid μDriver, according to one embodiment.

FIG. 3 is a block diagram of a basic circuit for a hybrid microdriver 300, according to one embodiment. The hybrid microdriver 300 includes a μDriver IC 110 coupled to a TFT backplane 212. The backplane 212 includes components for a sample and hold circuit, including a switching transistor 308 and a storage capacitor 310. However, any variant of a sample and hold circuit suitable for use in a TFT backplane may be used. The switching transistor 308 can be any type of insulated-gate field-effect transistor, such an n-type or a p-type semiconductor transistor. In this configuration, the switching transistor 308 has a gate electrode coupled with an input from a scan line 306, a first source/drain electrode coupled with an input from a data line 304, and second source/drain electrode coupled with the storage capacitor 310. In one embodiment, a voltage scan signal enables the storage capacitor 310 to charge, which ultimately provides an input signal used to trigger an emission pulse from one or more LED devices coupled to the μDriver IC 110.

Figure 4:
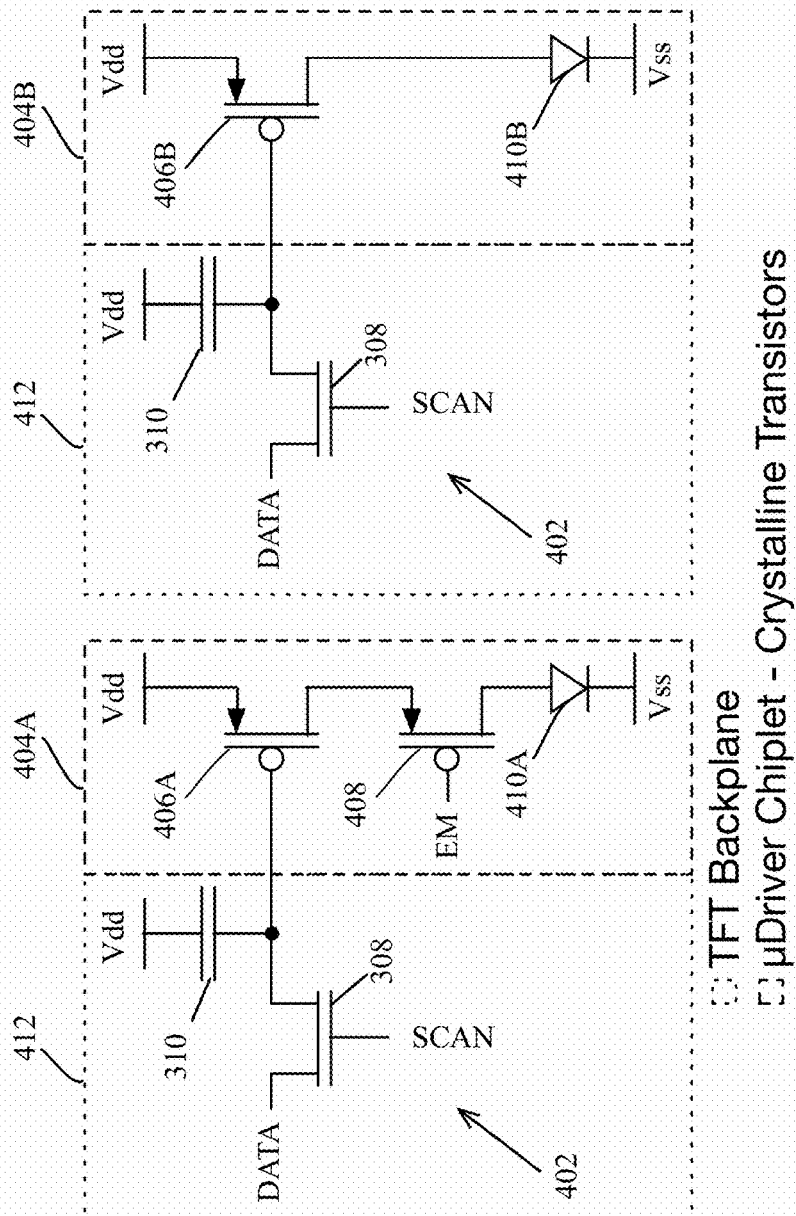
FIGS. 4A-B are circuit diagrams of two exemplary hybrid μDriver circuits.

FIGS. 4A-B are circuit diagrams of two exemplary hybrid microdriver circuits.

Each exemplary hybrid microdriver circuit includes a sample and hold circuit 402 on a TFT backplane 412, including at least a switching transistor 308 and a storage capacitor 310. The sample and hold circuit 402 couples to data and address inputs that are analogous to the data and row inputs illustrated in other exemplary circuits described herein. The exemplary hybrid microdriver circuits each include a μD chiplet circuit 404A-B, which are each variants of the μDriver IC 110 of FIGS. 1-3. Each μD chiplet circuit 404A-B includes at least one drive transistor 406A-B to drive (O)LEDs 410A-B. The drive transistor 406A-B and can source large currents using minimal geometry. Simple examples of analog implementations of the proposed embodiment are presented here, where the sample and hold circuit 402 of the TFT backplane couples with each respective μD chiplet circuit 404A-B to form an analog-only 2T1C architecture version having a single drive transistor 406B, or a 3T1C architecture version having a drive transistor 406A and a separate switching transistor 408 as emission switch.

Figure 5:
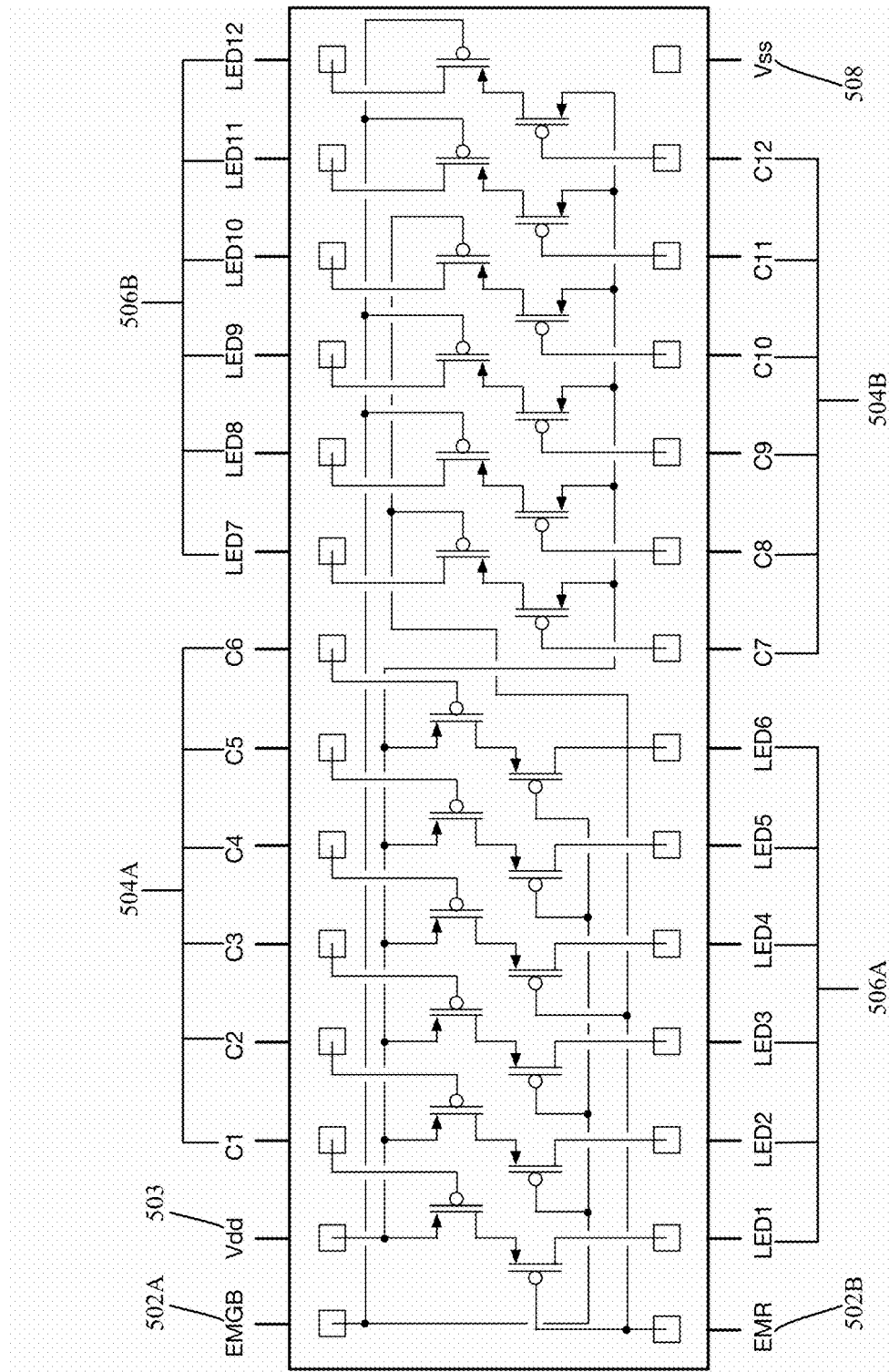
FIG. 5 is an illustration of an exemplary pad layout for a μDriver circuit.

FIG. 5 is an illustration of an exemplary pad layout for a microdriver circuit. Each microdriver circuit (e.g., μD chiplet, μDriver IC) includes a minimum number of pads, where the number of pads is defined by the number of sub-pixels controlled by the circuit, as well as the number, power and ground connections. The exemplary pad layout of FIG. 5 illustrates microdriver circuit configured to couple to a hybrid-backplane, where the circuit includes an emission switch transistor and a driving transistor. The circuit of FIG. 5 includes a power (Vdd) 503 input and a ground (Vss) 508 input, a green/blue emission control (EMGB) 502A, and a red emission control (EMR) 502B. Green and blue LEDs having a similar emission control profile may be used, allowing a shares emission control for those LEDs, while red LEDs have a separate emission control EMR 502B.

The microdriver circuit can drive a total of 12 sub-pixels (e.g., 4 RGB pixels) with 6 sub-pixels 506A (LED1-6) coupled to a first side of the microdriver circuit and 6 sub-pixels 506B (LED7-12) coupled to a second side of the microdriver circuit. A first set of control connections 504A (C1-6) can be used to set a gray level for the first set of sub-pixels 506A, while a second set of control connections 504B (C7-12) can be used to set a gray level for the second set of sub-pixels 506B, where each control line in each set of control lines 504A-B corresponds to a separate and respective sub-pixel 506A-B. The control connections 504A-B are connections to the storage capacitor terminals implemented on a TFT backplane, and the EMGB 502 and EMR 502B lines can be run in a layer physically underneath the driving and emission transistors.

Analog Input with Emission Pulse Width Modulation

Some types of light emitting devices, such as the μLEDs described herein, are generally driven at currents in the order of several tens of micro-amperes to achieve highest efficiency and lowest μLED power, which is a relatively high current for such class of devices. In traditional active-matrix TFT displays, LTPS or Oxide (e.g. IGZO or Indium Gallium Zinc Oxide) TFTs are sufficient to drive displays based on liquid crystal or organic LED technology. However, existing TFTs are not optimal for providing the relatively high currents used for μLEDs without employing large size TFTs or utilizing a large amount of power to drive the TFTs.

The crystalline silicon MOSFETs used in the uDriver ICs described herein have a mobility at least an order of magnitude higher than the LTPS TFTs used for backplane components and are more suitable to generate the current used to drive μLEDs. Additionally, the μLEDs described herein are more suitably driven using a constant current and modulating brightness using PWM based driving techniques, where emission levels can be determined as a function of the gray level input.

While one approach to generate a PWM signal is to provide digital n-bit data to every pixel and generate an emission pulse width as a function of digital data. This approach can utilize digital memory such as SRAM or flops, counters along with transistors as current sources, and emission control switches. However, such digital data driving approaches differ significantly from traditional display designs and may be difficult to integrate into traditional display technology in which analog voltage (e.g. 0-5V) is applied on the data line for gray scale control. Additionally while digital driving techniques may result in a simpler backplane design, including all pixel-driving circuits within the μDriver may result in a large and overall expensive design. To reduce the size and design complexity of the digital μDriver, some μDriver capacitors and switching transistors can be placed on a TFT backplane. The use of analog driving techniques may also simplify the integration of crystalline silicon based μDriver technology into existing displays.

Figures 6A, 6B:
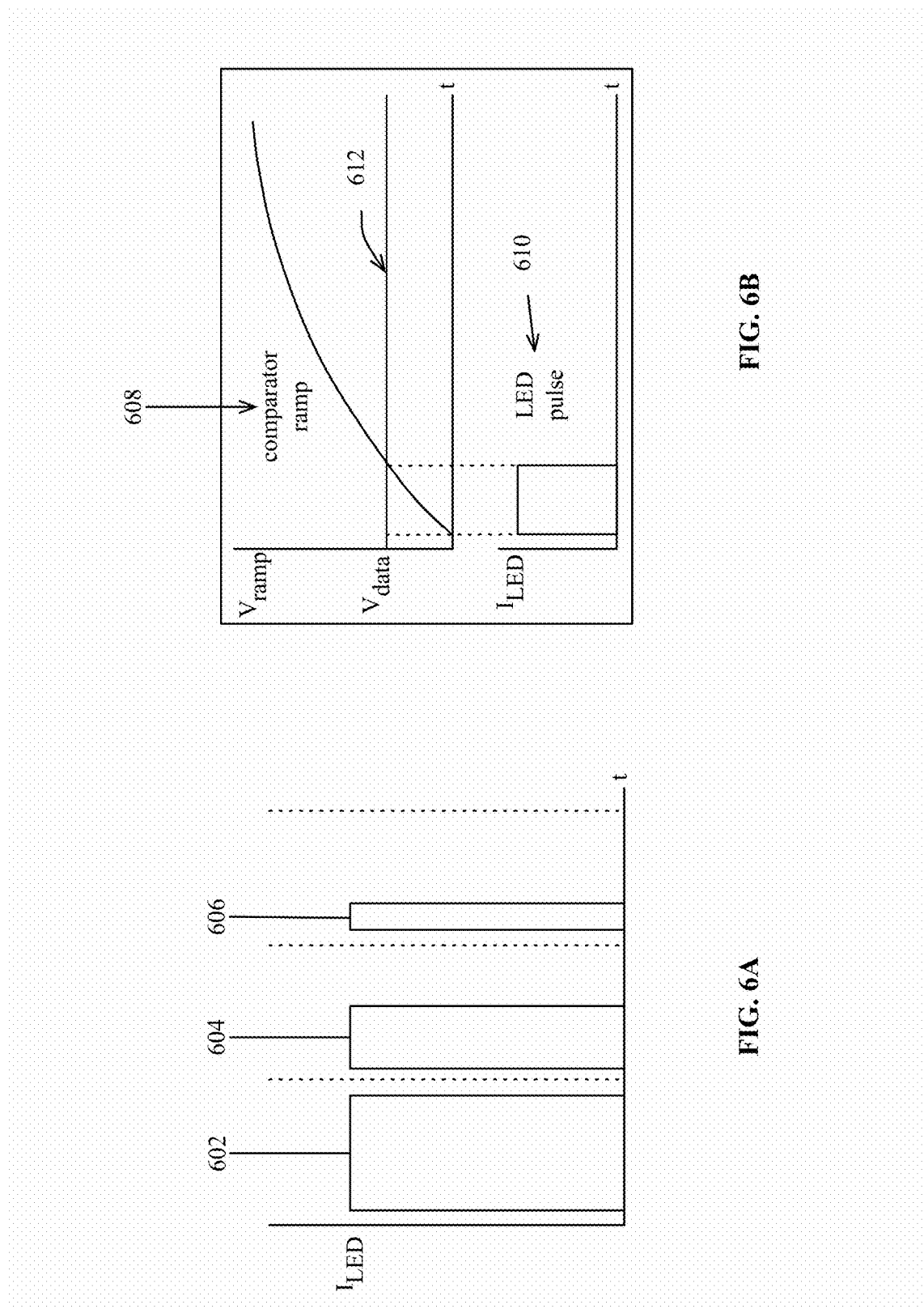
FIG. 6A is an illustration of pulse width modulation (PWM) in accordance with an embodiment.
FIG. 6B is an illustration of PWM determination in a μDriver based on a voltage ramp and an input data voltage, according to embodiments.

FIG. 6A is an illustration of pulse width modulation (PWM), also referred to as pulse length modulation, in which the pulse width or length sets the emission level, in accordance with an embodiment. A constant current can be used to drive the light emitting elements, where the length in which the current is supplied determines the duty cycle of the light emitting element. As illustrated, a longer pulse width or length corresponds to a higher brightness, with a narrower pulse corresponding to a lower brightness, where pulsing the emission of the light emitting element changes the perceived brightness of the element. Three pulse widths are illustrated, in which a long duration pulse 602 results in a high perceived emission brightness due to a longer emission duty cycle, a medium duration pulse 604 results in a medium perceived emission brightness due to a medium emission duty cycle, and a short duration pulse 606 results in a low perceived emission brightness due to a low emission duty cycle.

FIG. 6B is an illustration of PWM determination in a microdriver based on a voltage ramp and an input data voltage according to embodiments. Embodiments described herein can be configured to generate an LED pulse 610 at a constant current with a specific emission duty cycle based on a comparison between an increasing voltage comparator ramp 608 and an input data voltage 612. The input data voltage 612 is constant within a pulse period and can be supplied to a microdriver circuit from the storage capacitor of a sample and hold circuit in a TFT backplane. The comparator ramp 608 can be supplied by a circuit external to the microdriver (e.g., row driver, timing controller) or can be 'locally' generated within the microdriver circuit. The comparator ramp 608 is an increasing voltage that is compared to the input data voltage. Circuitry within the microdriver uses a comparison between the increasing voltage (Vramp) of the comparator ramp 608 and the input data voltage (Vdata) 612 to determine a length of the LED pulse 610. In one embodiment, a constant current (ILED) is output to the LED as long as the Vramp of the comparator ramp 608 is less than Vdata 612. When (Vramp) of the comparator ramp 608 exceeds (Vdata) 612, the current to the LED is shut off.

Multiple implementations of a microdriver circuit will be described to perform the PWM driving techniques of FIGS. 6A-B. In various embodiments, microdriver circuits can use differing comparison techniques and circuit designs to compare the data voltages with the voltage ramp to generate an emission pulse. The circuitry to generate the ramp signal used to determine the emission pulse width may be located in the row driving circuitry, timing control circuitry, or may be generated within the microdriver integrated circuit.

Described herein are several analog hybrid microdriver circuit designs and associated output waveforms. Each design provides for constant current driving of a light-emitting device using pulse width modulation. Designs provided in some embodiments are particularly suited for driving μLED devices as described herein, but may also be used to drive other light emitting devices including OLED devices. In general, the circuits described herein vary primarily in the design of the comparator logic used to control emission pulse length and each design provides various benefits and tradeoffs. In one embodiment, a microdriver circuit includes current comparator logic. In one embodiment a simplified comparator circuit is used to reduce circuit area. In one embodiment, a microdriver circuit having a relaxed comparator offset is used in conjunction with a multi-segmented ramp input. In one embodiment a microdriver circuit includes a relaxed comparator and a locally generated, multi-segmented voltage ramp.

In the exemplary circuits of the accompanying figures and as described below, certain specific details such as a number of input and output pads or specific power figures are described. It will be understood that the specific details of each circuit are exemplary of one implementation, and embodiments may vary in these specific details without violating the spirit of the invention described herein.

Hybrid Analog PWM μLED Driving Circuit Including Current Comparator Logic

FIGS. 7A-B show circuit diagrams for a hybrid analog PWM μLED Driving Circuit that uses a current comparator and an XOR gate as current control logic. The illustrated μDriver is exemplary of one embodiment, and various implementations are possible, including the other exemplary implementations described herein. One embodiment provides for a PWM LED driving circuit that can be used to control up to 12 subpixels of LED devices, which may be μLED devices. In alternate embodiments, a different number of subpixels may be controlled.

FIG. 7A is a diagram of the hybrid analog PWM LED driving circuit 700 including current comparator logic, according to one embodiment. The PWM LED driving circuit 700 is illustrated as driving a single LED or sub-pixel element. However, multiple circuits may be used to drive multiple sub-pixels for a display. The PWM LED driving circuit 700 includes a TFT backplane 701 having components that provide input a μDriver IC 710. The TFT backplane 701 may include any combination of LTPS (Low Temperature Poly Silicon) and/or Oxide (e.g., IGZO or Indium Gallium Zinc Oxide) TFTs. In one embodiment the TFT backplane 701 has components including an exemplary sample and hold circuit having a scan (e.g., Vselect) input coupled to a switching transistor 708, which is coupled to a Vdata input and a backplane storage capacitor 706. The voltage stored in the storage compactor 706 is supplied to the μDriver IC 710 via a Vdata input pad 709. A Vdata input pad 709 exists for each subpixel controlled by the μDriver IC 710. For a 12 subpixel controller, 12 pads may be used as Vdata input pads 709.

In one embodiment the μDriver IC 710 additionally includes a Vramp input pad 704 for a voltage ramp input and a Vstart input pad 702 for a start input voltage. The Vramp, Vstart and Vdata inputs can be used to determine the start time and length of the emission pulse provided to an LED device 720 coupled via a pixel output pad 718. For a 12-subpixel controller, 12 pads may be used as pixel output pads 718. In one embodiment the μDriver IC 710 includes a p-channel (e.g., PMOS) transistor as a drive transistor 716 to drive current the LED 720 during the emission pulse. The drive transistor 716 has source electrode coupled to power supply (e.g., VDD) input pad 711 and a gate electrode couple to a reference voltage from a reference voltage input pad 714. For RGB pixel arrangements, a first reference voltage can be used for red subpixels while a second reference voltage is used for green and blue subpixels, as shown by exemplary inputs EMGB 502A and EMR 502B in FIG. 5.

The drive transistor 716 couples to an emission switch transistor 717 that enables and disables the emission pulse. In one embodiment the gate of the emission switch transistor 717 couples to an XNOR gate 715. The inputs to the XNOR gate 715 are each provided by separate current comparator circuits 712A-B. In one embodiment the first comparator circuit 712A compares a current based on the Vstart input from the Vstart pad 702 with current based on the Vramp input from the Vramp pad 704. The second comparator circuit 712B can compare a current based on the Vramp input from the Vramp pad 704 with current based on the Vdata from the Vdata pad 709 for the subpixel. Both comparator circuits 712A-B couple to the SW pad 713, which is an enable/disable switch for the comparator circuits 712A-B, allowing the comparator circuits 712A-B to be enabled when in use and disabled when not in use, which reduces the overall power consumption of the μDriver IC 710.

FIG. 7B shows a diagram for an exemplary comparator circuit 730 that may be used as comparators 712A-B for the µDriver IC 710. The comparator circuit 730 can include a transistor series including a first transistor 732, second transistor 733, and third transistor 734, where the first transistor 732 is a PMOS transistor coupled to the IC power supply (e.g., Vdd) and gated by the Vramp input. The Vramp input for each comparator 712A-B couples to the first transistor 732. For the first comparator 712A the Vstart input couples to the second transistor 733. For the second comparator 712B the Vdata input couples to the second transistor 733. The third transistor 734 couples the second transistor 733 to ground/Vss and is gated by an SW input 736 which, for each comparator 712A-B couples to the SW input pad 713 of the µDriver IC 710. The SW input 736 is a switch input that may be used to enable or disable the comparator circuit 730, where the comparator circuit 730 is disabled when not in use to save power. The circuit output 735 has a voltage determined by whether the current is greater through the first transistor 732 or the second transistor 733, where the output 735 is at a low potential when the current in the second transistor is greatest and at a high potential when the current in the first transistor is greatest.

During operation, the second transistor 733 is biased as a current source via the Vdata/Vstart voltage, fixing the total current of the comparator. The ramp voltage generator causes Vramp to descend over time at a fixed slope. As the voltage of Vramp descends, the first transistor 732 begins to turn on as the Vramp-Vdd crosses the transistor threshold. Once the current generated by the first transistor 732 is greater than the current generated by the second transistor 733, the circuit output 735 snaps to high potential (e.g., Vdd).

Figure 8:
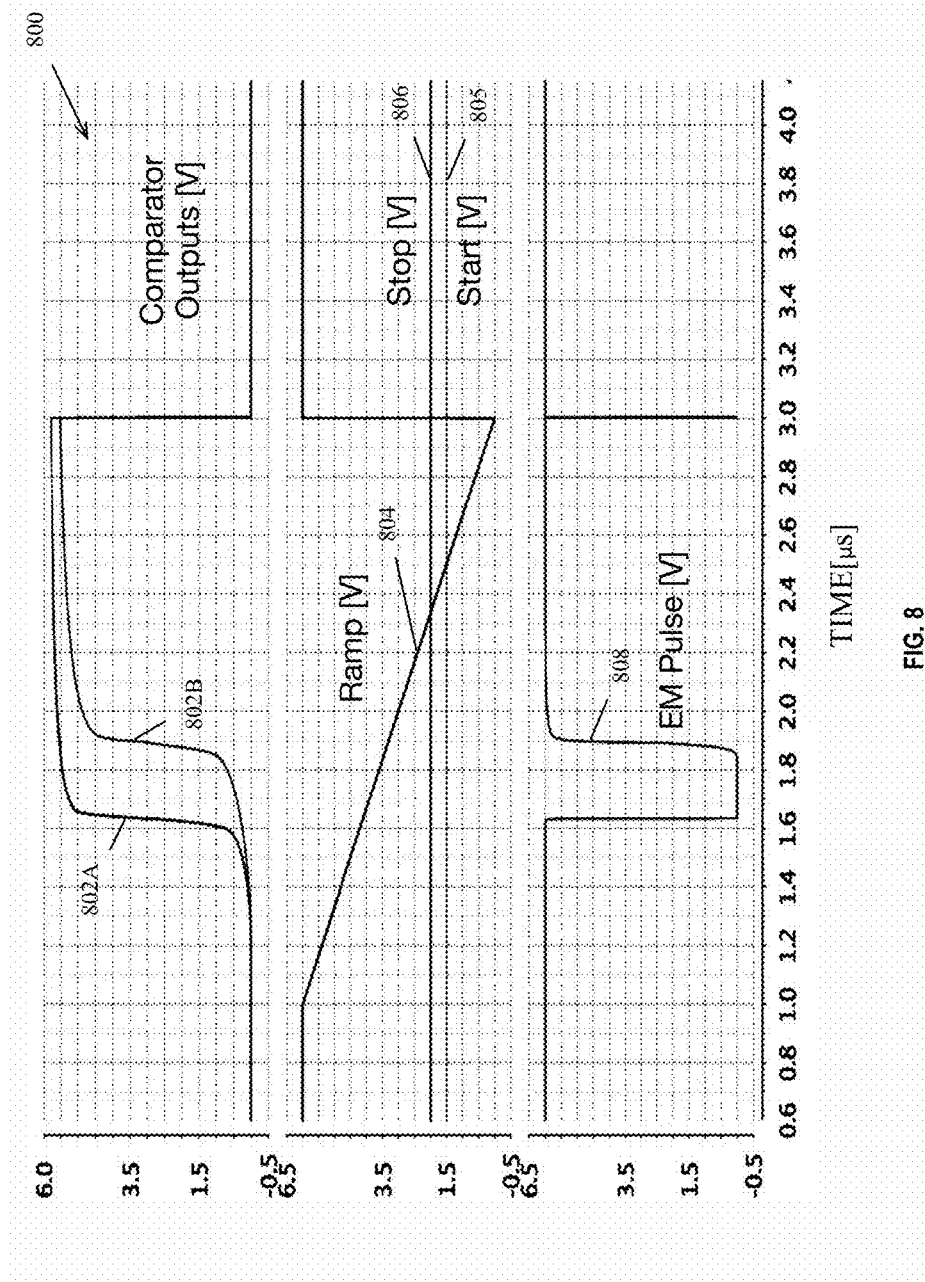
FIG. 8 is a diagram of a voltage output for a hybrid analog PWM LED driving circuit.

FIG. 8 is a diagram of a voltage output 800 showing operation of the hybrid analog PWM LED driving circuit 700 of FIG. 7. The voltage output 800 shows comparator outputs 802A-B based on a comparison of a ramp voltage 804, to a start voltage 805 and a stop voltage 806. Based on the comparator outputs, the LED driving circuit generates an emission pulse (e.g., EM pulse 808). An exemplary EM pulse 808 of approximately 300 nanoseconds (ns) is shown. In one embodiment an emission pulse of less than 1 ns may be generated.

During operation, a first comparator output 802A based on a comparison of the start voltage 806 to the ramp voltage 804 causes the emission logic to begin the EM pulse 808. The second comparator output 802A based on a comparison of the ramp voltage with the stop voltage 806 causes the emission logic to end the EM pulse 808. The input data voltage received from the TFT backplane determines the stop voltage 806.

Exemplary Hybrid Analog PWM µLED Driving Circuit with Reduced Power Comparator

Figure 9:
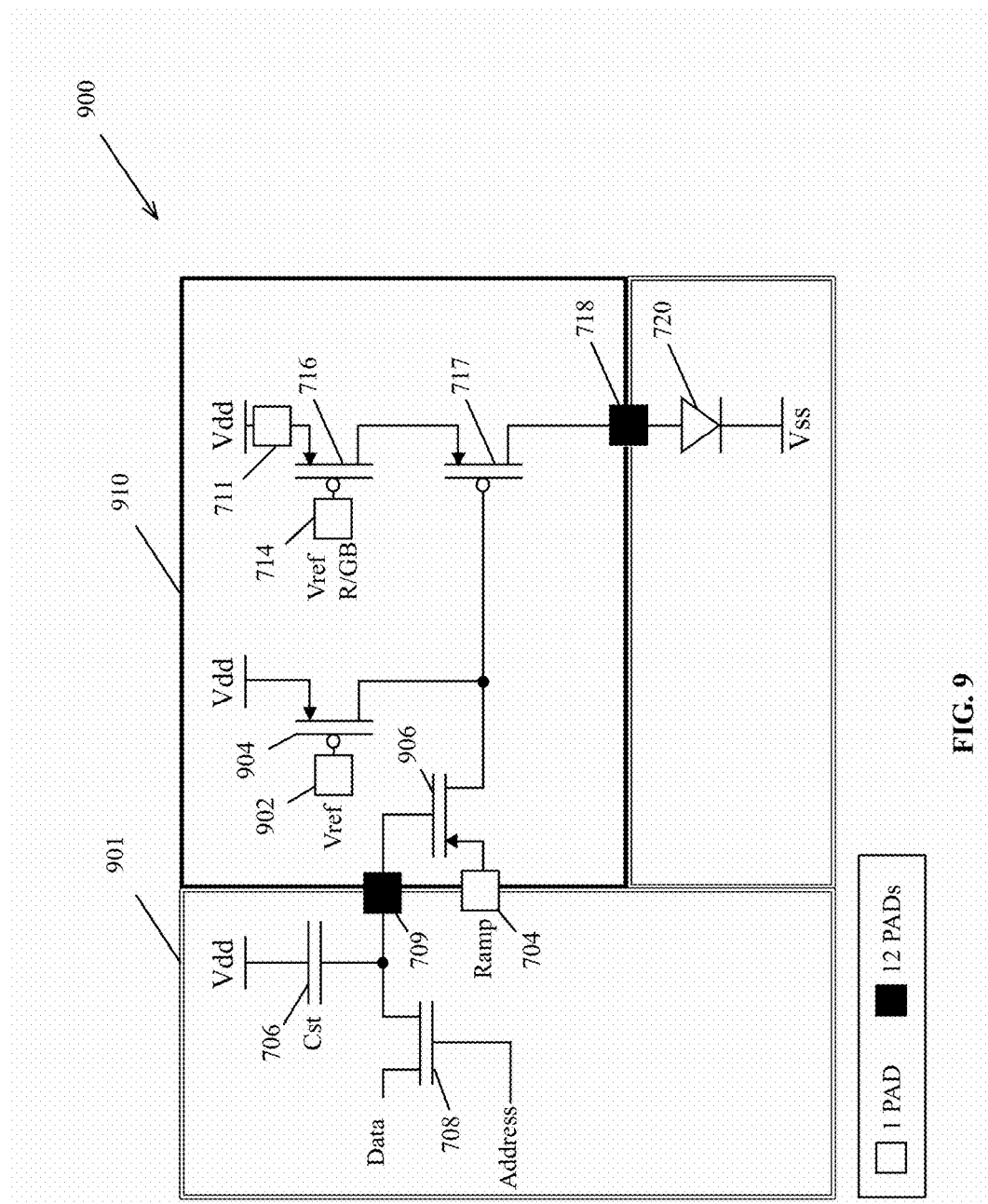
FIG. 9 is a diagram of a hybrid analog PWM μLED driving circuit with a reduced power comparator, according to an embodiment.

FIG. 9 is a diagram of a hybrid analog PWM µLED driving circuit 900 with a reduced power comparator, according to an embodiment. The hybrid analog PWM µLED driving circuit 900 provided by one embodiment includes similar components as the hybrid analog PWM µLED driving circuit 700 of FIG. 7, while utilizing different comparator logic. The PWM µLED driving circuit 900 includes a TFT backplane 901 coupled to a µDriver IC 910. In one embodiment the µDriver IC 910 receives a ramp input voltage from a ramp input pad 704. The ramp input pad 704 couples to the source of a ramp/data NMOS transistor 906 in the µDriver IC 910. The ramp/data NMOS transistor 906 has a a gate electrode coupled to the data storage capacitor 706 and a drain electrode coupled to the emission switch gate 717 and the drain of a pullup PMOS transistor 904. The pullup PMOS transistor 904 has a source electrode coupled to the power supply (Vdd) and has a gate electrode coupled to a voltage reference source (Vref) via a Vref pad 902. The reduced power comparison operation is performed by the ramp/data NMOS transistor 906 instead of the comparator logic 712A-B shown in the circuit 700 of FIG. 7.

Figure 10:
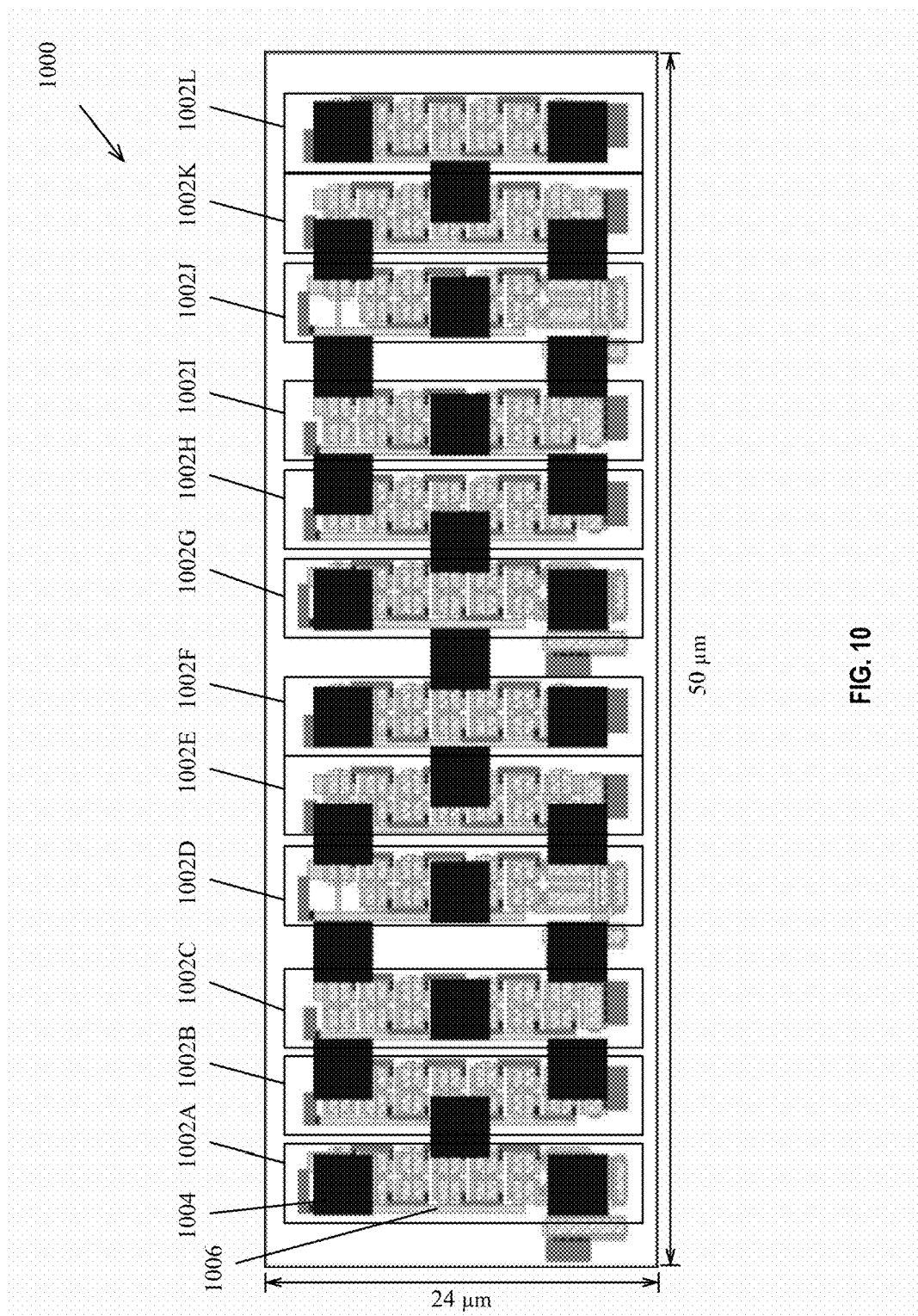
FIG. 10 shows an exemplary integrated circuit.

FIG. 10 shows an integrated circuit 1000 based on the PWM µLED driving circuit 900 of FIG. 9. The integrated circuit 1000 shows the logic elements 1006 and contact pads 1004 of the circuit diagram of FIG. 9. The illustrated integrated circuit 1000 is a 12 subpixel µLED driving circuit having 12 subpixel regions 1002A-L, although embodiments are not limited to 12 subpixels, and circuits may be designed and manufactured to control more than 12 or fewer than 12 subpixels.

Relative to the circuit 700 of FIG. 7, an integrated circuit 1000 based on the circuit 900 of FIG. 9 can realize significantly reduced circuit area per subpixel, as a tradeoff for lower pulse resolution. In one embodiment, the integrated circuit 1000 can be manufactured having a minimum lateral dimension of 24 µm and a maximum lateral dimension of 50 µm.

Returning to FIG. 7, the circuit 700 is in emissive operation when the drive transistor 716 provides current to the LED 720 during the emission pulse. The emission pulse becomes active when the ramp input voltage received via the ramp input pad 906 drops below the data voltage stored in the data storage capacitor 706. The emission pulse ends when the ramp input voltage reaches the data voltage. Operation of the hybrid analog PWM µLED driving circuit 900 of FIG. 9 is further illustrated by the electrical performance evaluation 1100 of FIG. 11.

Figure 11:
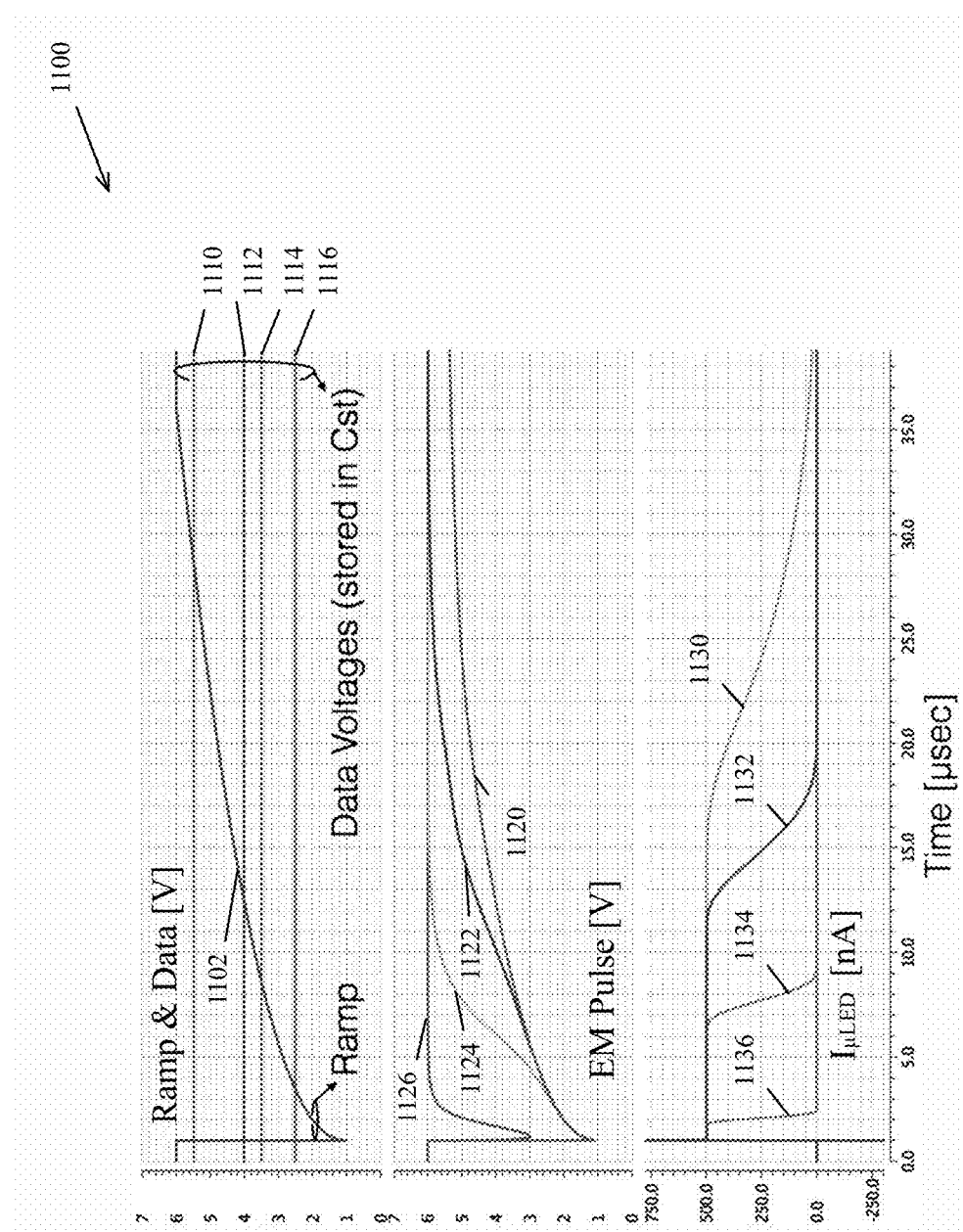
FIG. 11 is shows an exemplary preliminary electrical performance evaluation for an exemplary hybrid analog PWM μLED driving circuit.

FIG. 11 is shows an exemplary preliminary electrical performance evaluation 1100 of the PWM µLED driving circuit 900 of FIG. 9. As illustrated, the input data voltages for various gray levels are stored in a TFT based storage capacitor Cst and are compared against a repeating ramp voltage 1102, which in one embodiment is supplied to the integrated circuit via a row driver or timing control circuit. For the circuit 900 of FIG. 9, progressively lower data voltages 1110-1116 result in progressively shorter EM pulses 1120-1126, in which current is driven to the LED for progressively shorted periods 1130-1136, down to a minimum pulse width of approximately 80 ns.

As exemplified by the circuits of FIG. 7 and FIG. 9, lower power and smaller silicon area may be achieved by the use of simpler comparator designs at the cost of emission pulse resolution. A comparator having a sufficiently low offset is important for some µDriver circuit designs to achieve a narrow emission pulse used for low gray levels. However, low offset comparator designs consume additional power and circuit area relative to comparator designs having a higher voltage offset. Accordingly, the comparator design plays a key role in creating emission control logic capable of producing a sufficiently narrow emission pulse for low gray level output while minimizing circuit area and power consumption.

Embodiments described below provide various designs to relax comparator offset requirements by incorporating low voltage digital logic into the PWM emission control logic of the µDriver IC. Additionally, a multi-segmented and/or non-linear ramp may also be used to further relax offset requirements for the comparator logic.

Figure 12:
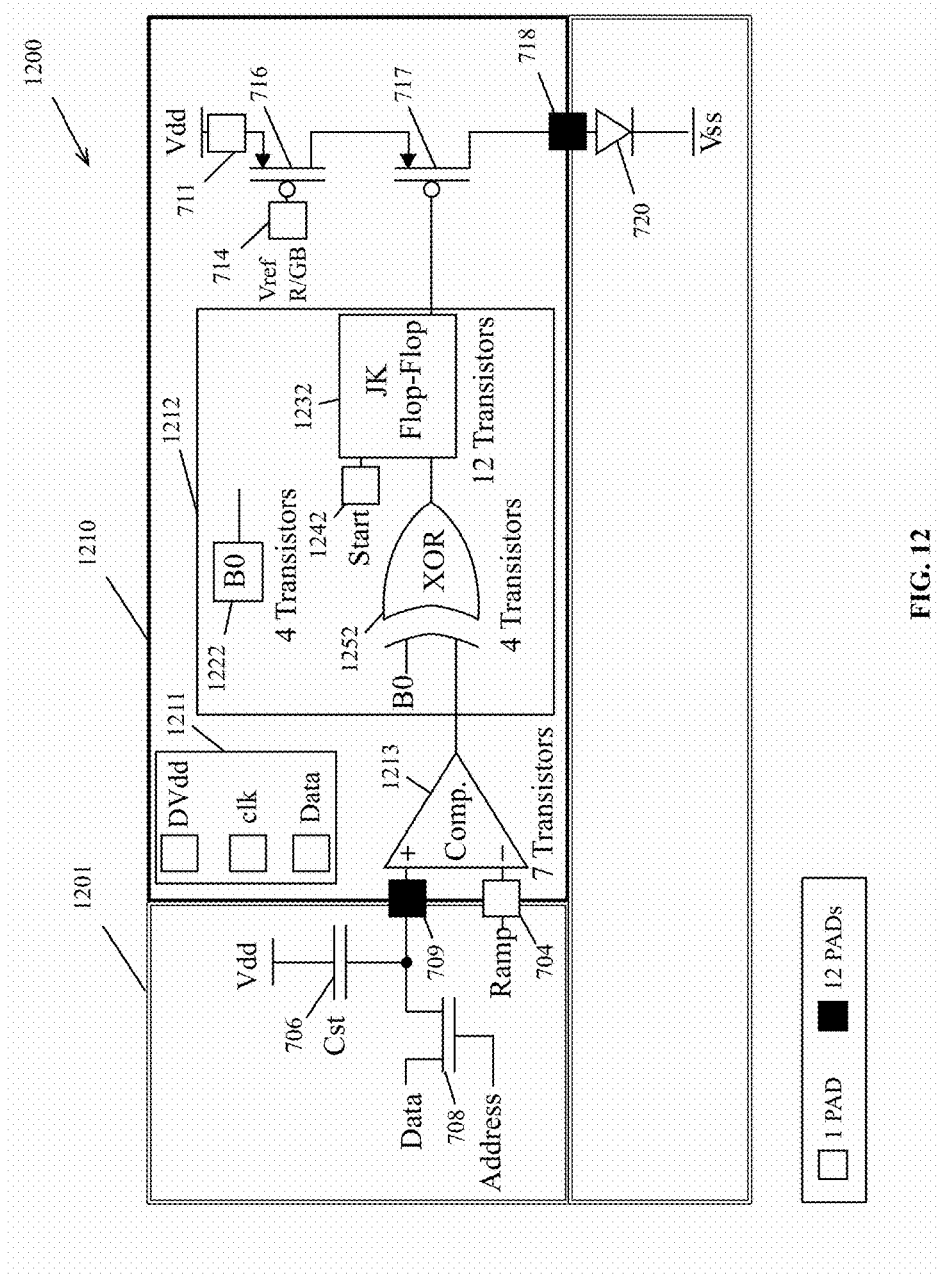
FIG. 12 is a diagram of an additional hybrid analog PWM μLED driving circuit, according to an embodiment

Exemplary Hybrid Analog PWM µLED Driving Circuit Having a Relaxed Comparator Offset FIG. 12 is a diagram of an additional hybrid analog PWM µLED driving circuit 1200, according to an embodiment. In one embodiment the hybrid analog PWM µLED driving circuit 1200 includes a TFT backplane 1201 having components similar to other circuits described herein and a µDriver IC 1210 including comparator logic 1213 and low voltage digital logic components 1212 to control emission pulse duration. In one embodiment the low voltage digital logic components 1212 include a four transistor ramp segment selector 1222, a start input coupled to a start input pad 1242, a 12 transistor JK flip-flop 1232, and a four transistor XOR logic gate 1252, although the specific designs of the low voltage digital logic components 1212 can vary. Additionally, the µDriver IC 1210 includes an additional set of input pads 1211 for the low voltage digital logic 1212 that is shared by the emission logic for each subpixel, including a digital power supply (DVdd), clock signal and a digital data input.

In one embodiment provides for a power optimization in which the comparator logic 1213 is disabled at the end of an emission pulse. A feedback mechanism may be included such that the comparator logic 1213 is power gated at the end of each emission pulse and reset at the beginning of each frame. Such power optimization can reduce the power consumed by the µDriver circuit 1210 by reducing or eliminating the power consumed by the comparator logic 1213 between emission pulses.

In an alternate embodiment the PWM µLED driving circuit 1200 may exclude the JK flip-flop 1232 and substitute control logic coupled to the XOR gate 1252. In such embodiment, the control signal timing is key to the proper operation of the circuit.

In one embodiment, the µDriver IC 1210 includes 34 connector pads to control 12 subpixel elements, including 24 per-subpixel connector pads for LED output and Vdata input. In such embodiment, the µDriver IC 1210 occupies between 75-90 µm$^2$ of total silicon area, including pad and circuit area. The comparator circuit 1213 can consume between 0 and 10 nA, which is emission dependent.

In one embodiment the PWM µLED driving circuit 1200 is operated using a multi-segmented ramp. Multi-segmented digital-to-analog (DAC) conversion may be used such that the encoding for low gray levels that require a finer comparator resolution and shorter pulse widths are grouped within a segment having a lower number of discrete gray levels within the group. Accordingly, higher ramp swings may be used to generate the shorter emission pulses associated with lower gray levels. In such embodiment, the ramp signal may be provided by ramp signal generation logic in row driver or timing control logic that controls pixel output for a display device including the PWM µLED driving circuit 1200.

Figure 13:
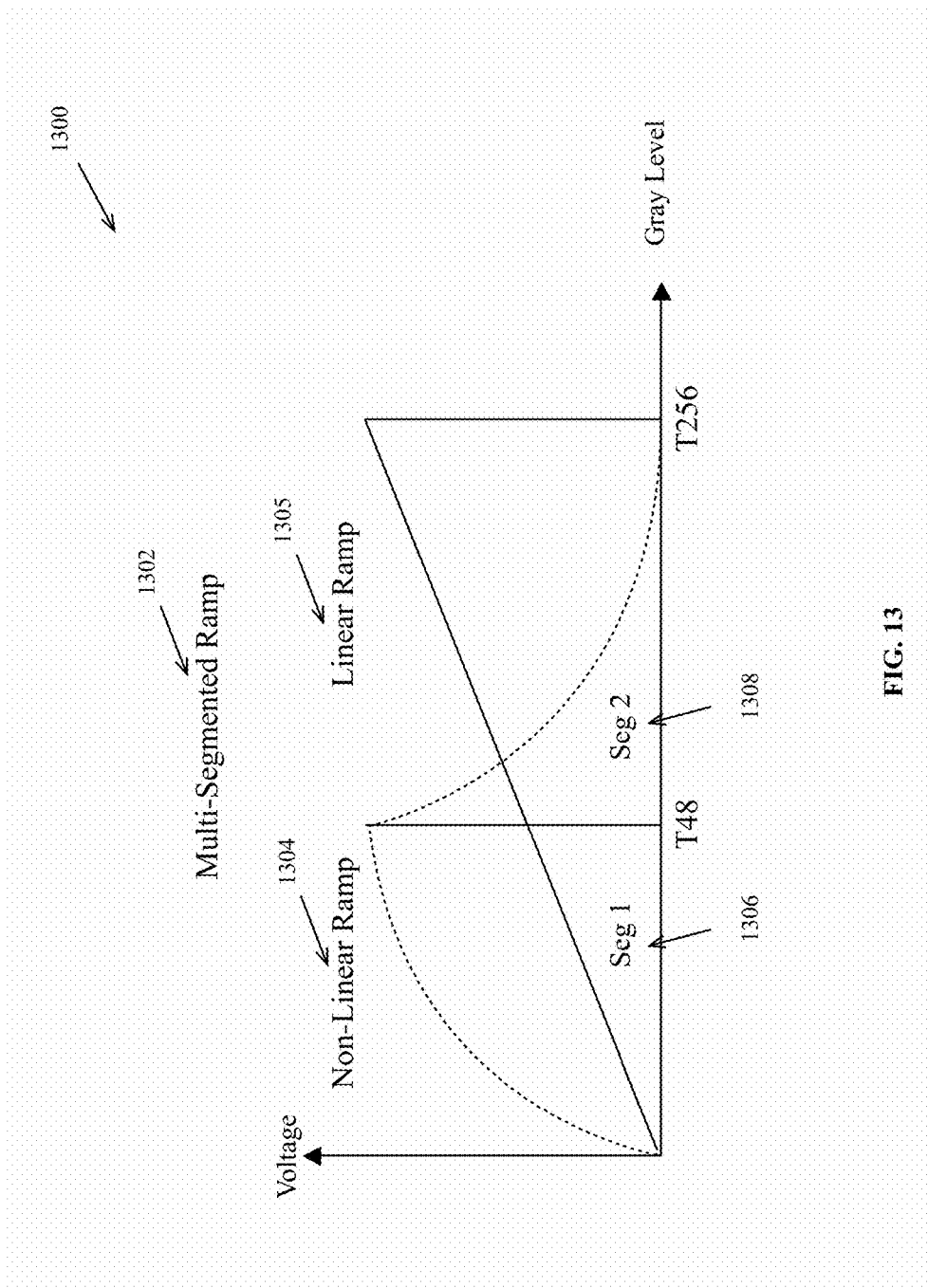
FIG. 13 is an exemplary voltage chart of a multi-segmented voltage ramp input, according to an embodiment.

FIG. 13 is an exemplary voltage chart 1300 of a multi-segmented ramp input provided to a µLED driving circuit such as the PWM µLED driving circuit 1200 of FIG. 12, according to an embodiment. A multi-segmented ramp 1302 having a first ramp segment 1306 and a second ramp segment 1308 is shown. However, the multi-segmented ramp 1302 can include any number of individual segments associated with different gray level outputs. Additionally, the multi-segmented ramp 1302 may be a non-linear ramp 1304 comprised of successive rising and falling segments, or may be a linear ramp 1305. The non-linear ramp 1304 and linear ramp 1305 may each be associated with an uneven distribution of gray levels. For example, where 256 discrete gray levels are supported, 48 gray levels having 48 different pulse widths may be associated with a first segment 1306 while the remaining 208 discrete gray levels may be associated with a second segment 1308. Accordingly, a greater voltage differential exists between each of the individual lower gray levels, relaxing the voltage offset for the comparator logic when generating short emission pulses, allowing a more accurate translation between analog input voltage levels and emission pulse lengths.

Figure 14:
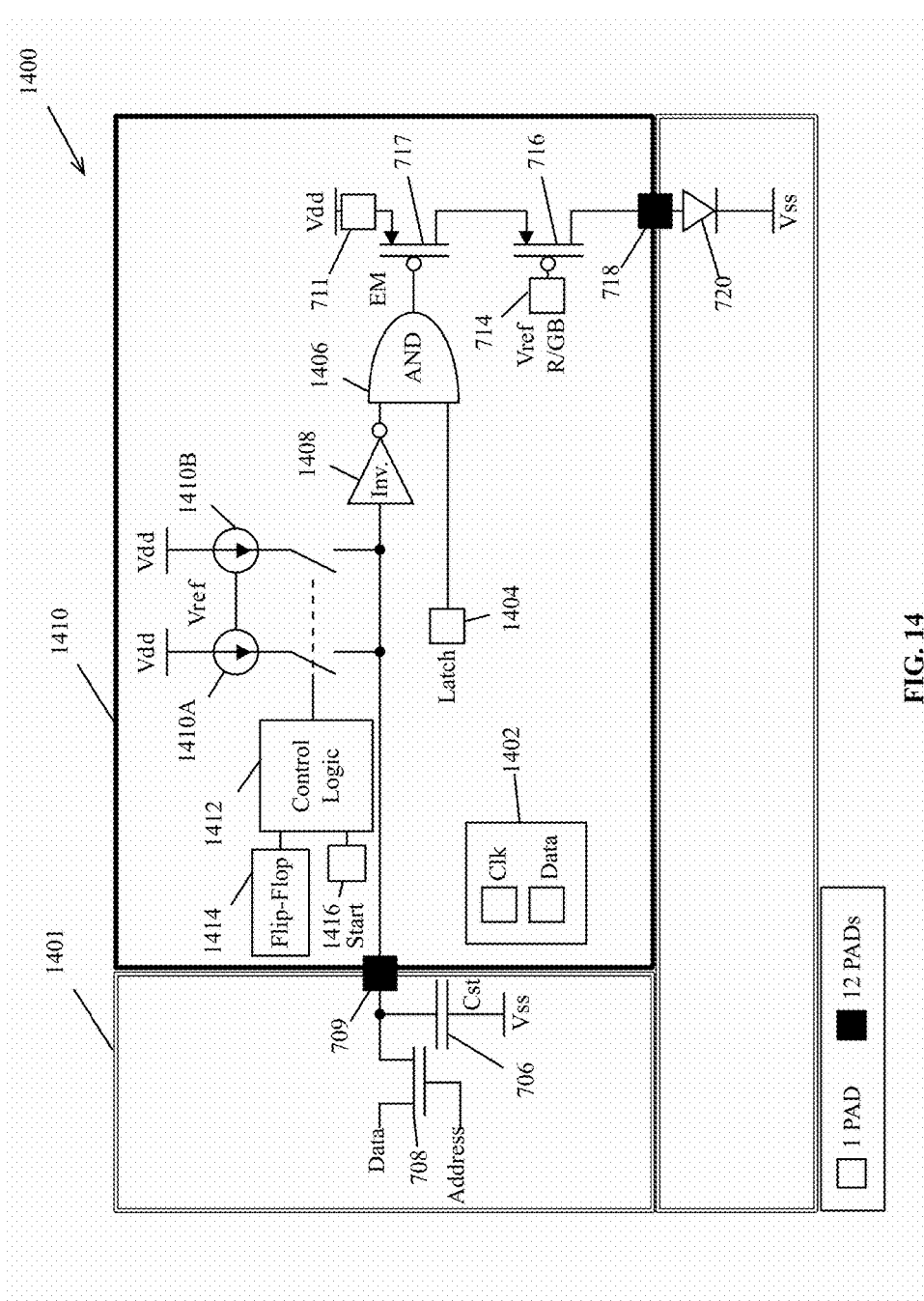
FIG. 14 is a diagram of an additional hybrid analog PWM μLED driving circuit, according to an embodiment.

Exemplary Hybrid Analog PWM µLED Driving Circuit with a Local Multi-Segmented Ramp FIG. 14 is a diagram of an additional hybrid analog PWM µLED driving circuit 1400, according to an embodiment. The hybrid analog PWM µLED driving circuit 1400 includes a TFT backplane 1401 similar to other circuits described herein, as well as a µDriver IC 1410 including local ramp generation logic. The local ramp generation logic includes control logic 1412 to control a set of current sources 1410A-B. The control logic is coupled to a start input pad 1416 and a flip-flip 1414. Additionally, digital input pads 1402 receive clock and data inputs for the digital logic components of the control logic 1412. The control logic can be configured to generate a constant ramp or a programmed ramp, which can be linear or non-linear. Additionally, the generated ramp signal may be multi-segmented, such that lower gray levels may be associated with higher resolution ramp signals.

The use of digital control logic 1412 to generate a local ramp signal, in addition to the use of a multi-segmented and/or non-linear ramp signal can significantly relax the comparator design requirements. In one embodiment, an inverter 1408 may be used as a comparator. In such embodiment, a static CMOS inverter or another inverter design having little to no static power dissipation may be used.

In one embodiment the inverter 1408 couples to an AND gate 1406. The AND gate 1406 additionally couples to a latch input pad 1404 and the gate electrode of the emission switch transistor 717. The input via the latch input pad 1404 and the output of the inverter 1408 control the length of the current pulse supplied to the LED 720. In one embodiment, the current drive assembly and emission switch for the µDriver IC 1410 of FIG. 14 differs from other circuits described herein in that the emission switch transistor 717 gates the power supply (Vdd) to the current drive transistor 716 instead of gating the current supplied to the LED 720.

In one embodiment the hybrid analog PWM µLED driving circuit 1400 shares a TFT storage capacitor Cst 706 with the ramp generator logic. Vdata input charges Cst 706 and enables an emission pulse. The control logic 1412 uses one of the current sources 1410A-B to add additional charge to Cst 706 until the charge in Cst 706 reaches a reference voltage, which trips the inverter 1408 and, based on the latch input 1404, ends the emission pulse.

Figure 15:
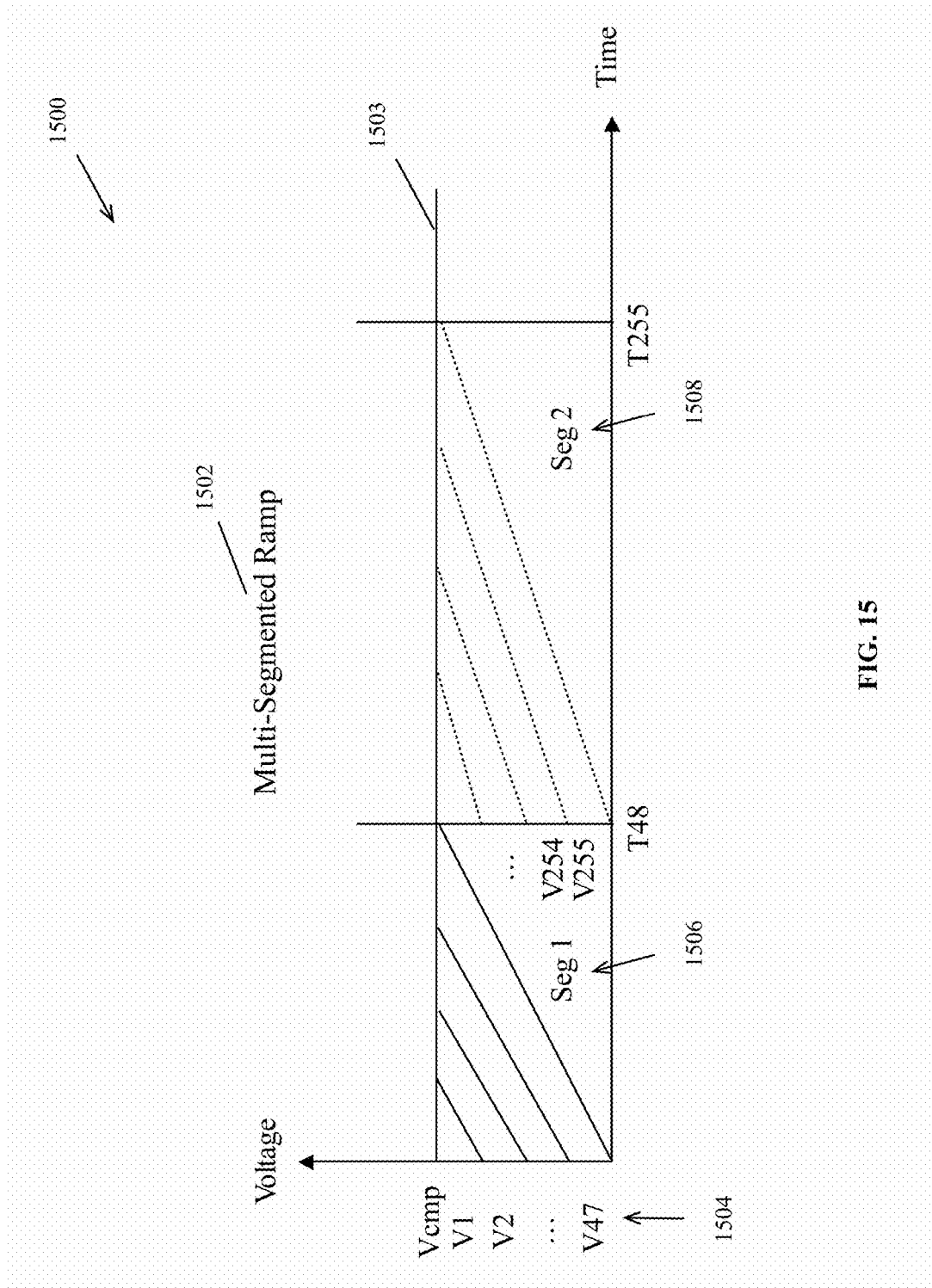
FIG. 15 illustrates an additional exemplary voltage chart of a multi-segmented voltage input ramp.

FIG. 15 illustrates an exemplary voltage chart 1500 of a multi-segmented ramp 1502 generated by the µLED driving circuit 1400 of FIG. 14. Voltage ramps of varying initial voltages 1504 can be associated with different gray levels. The ramp signal initial voltages can be based at least in part based on the Vdata voltage supplied to the circuit, with higher initial voltages resulting in reduced emission pulse length. The emission pulse for each gray level ends when the ramp voltage begins at its initial voltage and ends when the ramp voltage reaches a pre-determined comparator offset 1503. Lower initial voltages and/or lower ramp slopes result in longer emission pulses and higher gray levels. Within the time duration allotted to each frame, a smaller number of lower gray levels can associated with an initial period, while a higher number of higher gray levels having a higher pulse duration can be associated with later portions of the frame. For example, lower gray levels can be associated with higher sloped ramps associated with a first segment 1506 within a frame to enable higher emission pulse length resolution, relaxing comparator offset requirements. Higher gray levels can be associated with lower sloped ramps in a second segment 1508 within the frame. The relatively longer emission pulses of the second segment 1508 can reduce the relative resolution required for each gray level. While two segments 1506, 1508 are illustrated, any number of segments may be used. Additionally, while linear ramps are illustrated, non-linear ramps as shown in FIG. 13 may also be used.

Hybrid MicroDriver Display System

Figure 16:
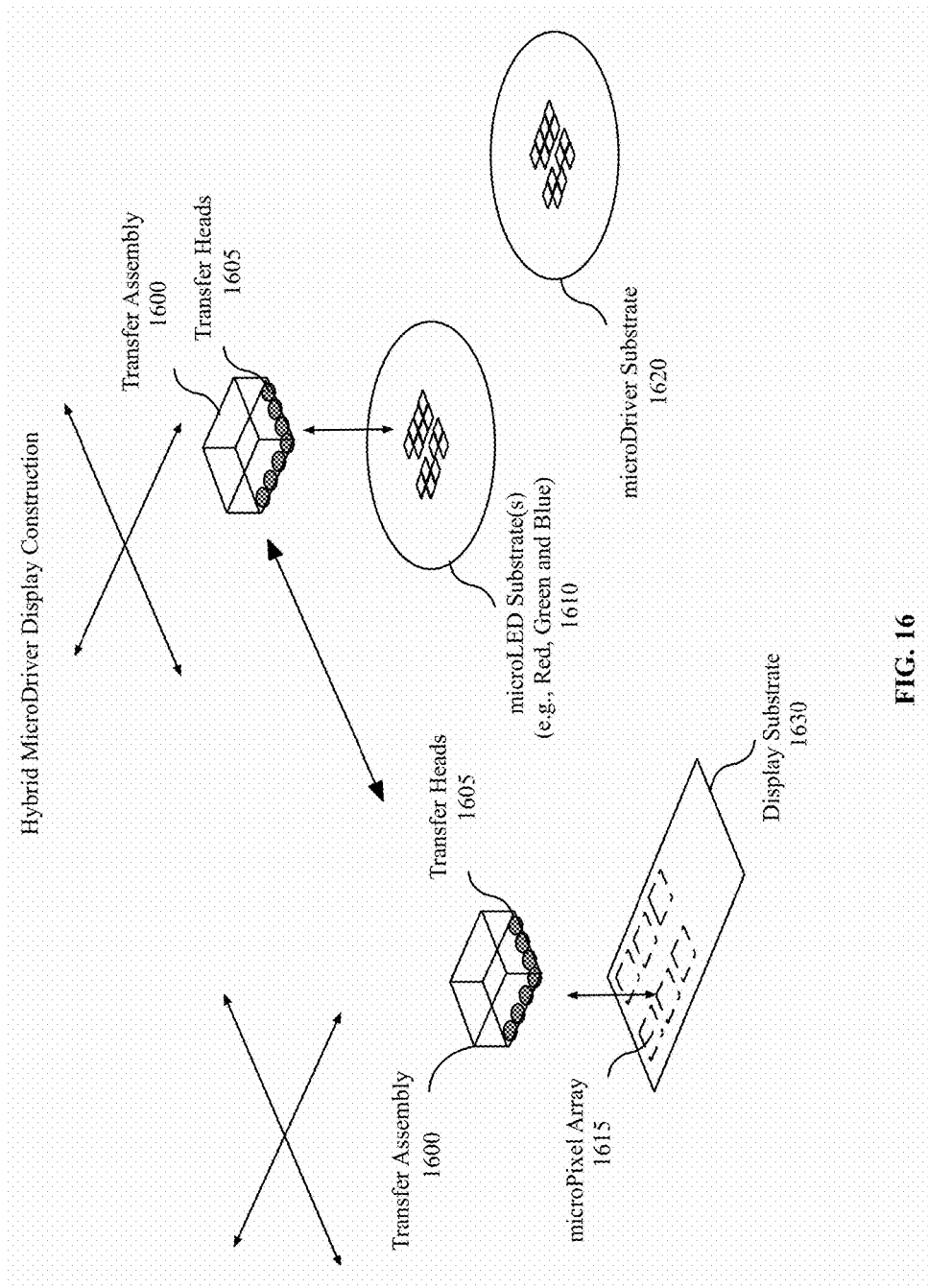
FIG. 16 illustrates the processing of substrates of μDriver and μLEDs into a receiving substrate for a hybrid μDriver and μLED display, according to an embodiment.

FIG. 16 illustrates the processing of substrates of μDriver and μLEDs into a receiving substrate for a hybrid μDriver and μLED display, according to an embodiment. In one embodiment, separate carrier substrates including one or more μLED substrate(s) 1610 and a μDriver substrate 1620. One or more transfer assemblies 1600 can be used to pick up and transfer microstructures from the carrier substrates (e.g., 1610, 1620) to the receiving display substrate 1630.

In one embodiment, separate transfer assemblies 1600 are used to transfer any combination of μLED colors from the μLED substrate 1610 and μDriver substrate 1620. In one embodiment the display substrate 1630 is prepared with distribution lines to connect the various the μLED and μC structures. The display substrate can also be prepared with one or more layers of TFT components as described herein. The distribution lines can be coupled to landing pads and an interconnect structure to electrically couple the μLED devices, the μC devices, and the TFT components. The interconnect structure can also be designed to couple the various μC devices to each other to create a μDriver relay to enable communication between the μDriver ICs. The receiving substrate can be a display substrate 1630 of any size ranging from micro displays to large area displays, can be a lighting substrate for LED lighting, or for use as an LED backlight for an LCD display. In one embodiment the μLED and μDriver structures are bonded to the same side of the substrate surface. However, the μDriver and μLED structures may also be bonded to alternate sides of the substrate surface.

The μDriver and μLEDs are described herein as coupling to a substrate via connection pads. However, the bonds between the components can be made using various connections such as, but not limited to, pins, conductive pads, conductive bumps, and conductive balls. Metals, metal alloys, solders, conductive polymers, or conductive oxides can be used as the conductive materials forming the pins, pads, bumps, or balls. In an embodiment, heat and/or pressure can be transferred from the array of transfer heads 1605 to facilitate bonding. In an embodiment, conductive contacts on the μC, μLED devices, or other display components (e.g., sensor devices) are thermocompression bonded to conductive pads on the substrate. In this manner, the bonds may function as electrical connections to the μDriver IC and μLED devices. In one embodiment bonding includes indium alloy bonding or gold alloy bonding. Other exemplary bonding methods that may be utilized with embodiments include, but are not limited to, thermal bonding and thermosonic bonding.

The specifics of the display substrate 1630 can vary based on the target application. In one embodiment the display substrate 1630 is used to form a microPixel array 1615 for use in a high-resolution display. In one embodiment the microPixel array 1615 can have up to 440 pixels per inch, although other embodiments may be manufactured at higher PPIs.

Hybrid MicroDriver Display System

Figure 17:
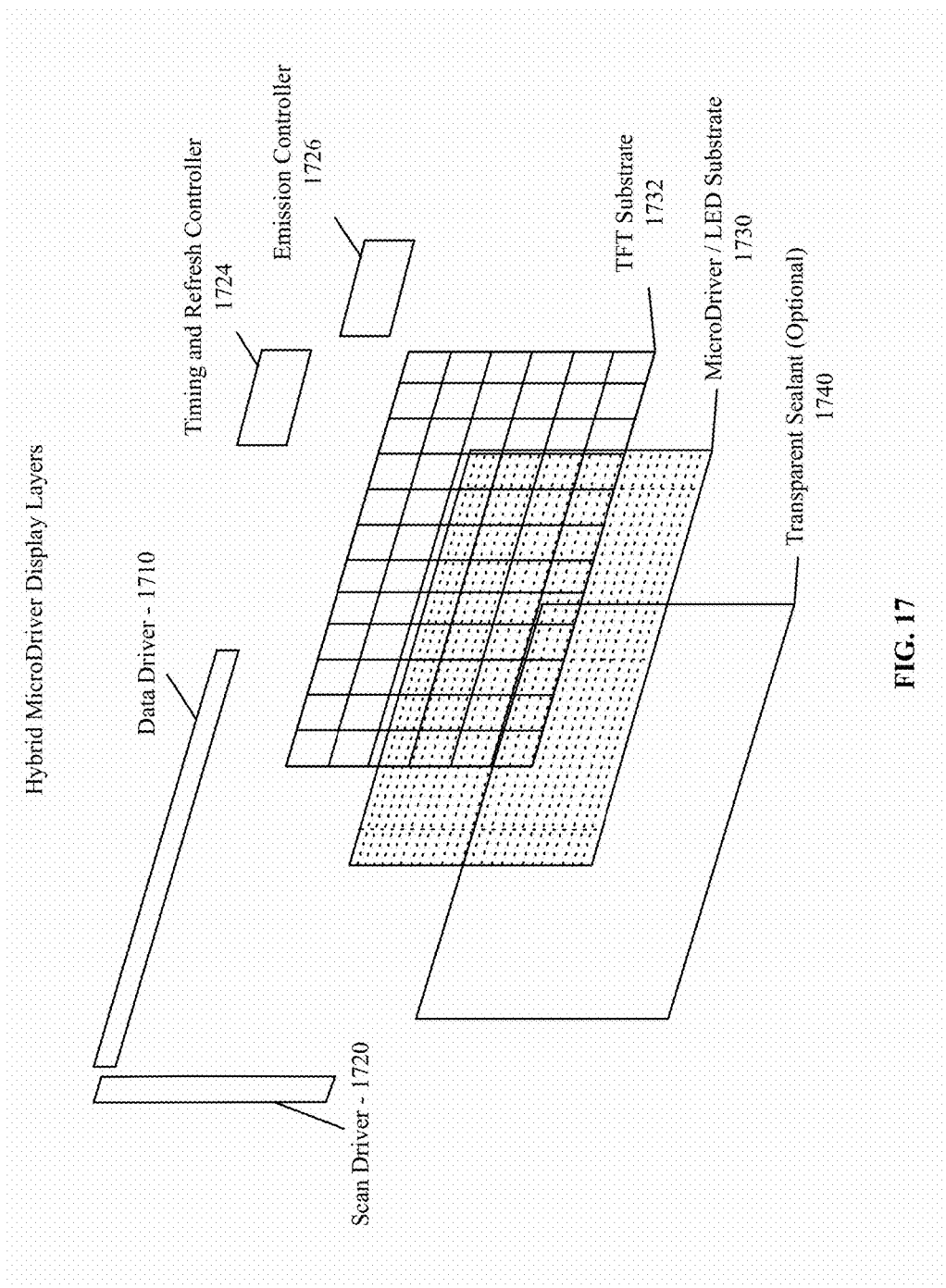
FIG. 17 is an illustration of a hybrid μDriver display, according to an embodiment.

FIG. 17 is an illustration of a hybrid micro-driver display, according to an embodiment. In one embodiment, a μDriver and LED substrate 1730 that is prepared with distribution lines to interconnect a micro-matrix of μDriver IC devices and LEDs (e.g., μLEDs, OLEDs, etc. In one embodiment a TFT substrate 1732 including LTPS and/or Oxide transistors and capacitors are deposited or integrated with the μDriver/LED substrate 1730. An optional sealant 1740 can be used to secure and protect the substrate. In one embodiment, the sealant is transparent, to allow a display or lighting substrate with top emission LED devices to display through the sealant. In one embodiment, the sealant is opaque, for use with bottom emission LED devices. In one embodiment an optional a data driver 1710 and a scan driver 1720 couple with multiple data and scan lines on the display substrate. In one embodiment, each of the smart-pixel devices couple with a refresh and timing controller 1724. The refresh and timing controller 1724 can address each LED device individually, to enable asynchronous or adaptively synchronous display updates. In one embodiment, an emission controller 1726 can couple with the μDriver/LED substrate 1730 to control the brightness of LEDs, for example, via manipulation of emission control inputs. In one embodiment the emission controller 1726 can couple with one or more optical sensors to allow adaptive adjustment of emission pulse length based on ambient light conditions. In one embodiment the emission controller 1726 can adjust display brightness via manipulation of reference voltages supplied to the μDrivers.

A display system may additionally include a receiver to receive display data from outside of the display system. The receiver may be configured to receive data wirelessly, by a wire connection, by an optical interconnect, or any other connection. The receiver may receive display data from a processor via an interface controller. In one embodiment, the processor may be a graphics processing unit (GPU), a general-purpose processor having a GPU located therein, and/or a general-purpose processor with graphics processing capabilities. The display data may be generated in real time by a processor executing one or more instructions in a software program, or retrieved from a system memory. A display system may have any refresh rate, e.g., 50 Hz, 60 Hz, 100 Hz, 120 Hz, 200 Hz, or 240 Hz.

Depending on its applications, a display system may include other components. These other components include, but are not limited to, memory, a touch-screen controller, and a battery. In various implementations, the display system may be a television, tablet, phone, laptop, computer monitor, automotive heads-up display, automotive navigation display, kiosk, digital camera, handheld game console, media display, e-book display, or large area signage display.

In utilizing the various embodiments of this disclosure, it would become apparent to one skilled in the art that combinations or variations of the above embodiments are possible for controlling emission of a display panel. Although the present disclosure has been described in language specific to structural features and/or methodological acts, it is to be understood that the disclosure defined in the appended claims is not necessarily limited to the specific features or acts described. The specific features and acts disclosed are instead to be understood as particularly graceful implementations of the claimed disclosure and useful for illustrating the present disclosure.

The invention claimed is:

1. A display driver hardware circuit comprising:
a thin film transistor (TFT) backplane; and
an integrated circuit including emission logic, the emission logic including comparator logic to compare a data voltage from a storage capacitor to a voltage ramp provided via the TFT backplane, the comparator logic to cause the emission logic to generate an emission pulse to an LED device, the emission pulse adjustable from a continuous duty cycle to a non-continuous duty cycle, and wherein the integrated circuit is to switch and drive a plurality of LED devices;
wherein the integrated circuit is comprised of crystalline silicon and contained within a chip of an array of chips coupled with the TFT backplane.

2. The display driver hardware circuit as in claim 1, wherein the TFT backplane includes a low temperature poly-silicon (LTPS) transistor.

3. The display driver hardware circuit as in claim 1, wherein the TFT backplane includes an Indium Gallium Zinc Oxide (IGZO) transistor.

4. The display driver hardware circuit as in claim 1, wherein the chip has a maximum lateral dimension of 1 to 100 μm.

5. The display driver hardware circuit as in claim 1, wherein the comparator logic includes a current comparator coupled to the voltage ramp provided by the TFT backplane.

6. The display driver hardware circuit as in claim 1, wherein the comparator logic comprises a transistor coupled to the storage capacitor.

7. The display driver hardware circuit of claim 1, wherein the integrated circuit has a maximum lateral dimension of 1 to 100 μm.

8. The display driver hardware circuit as in claim 7, wherein the integrated circuit has a maximum lateral dimension of 50 μm.

9. The display driver hardware circuit as in claim 1, wherein the emission logic is to supply a constant current to the LED device, the constant current based on an adjustable reference voltage.

10. The display driver hardware circuit as in claim 9, wherein the emission logic is to terminate current to the LED device to end the emission pulse based on output of the comparator logic.

11. The display driver hardware circuit as in claim 1, wherein each of the plurality of LED devices is a subpixel for a display device.

12. A display driver hardware circuit comprising:
a thin film transistor (TFT) backplane; and
an integrated circuit including emission logic to cause an LED emission pulse, the LED emission pulse adjustable from a continuous duty cycle to a non-continuous duty cycle, wherein the integrated circuit is a crystalline silicon integrated circuit coupled to a ramp signal generator to cause a voltage ramp having a slope based on an analog input voltage from the TFT backplane, wherein a length of the LED emission pulse is related to the slope of the voltage ramp.

13. The display driver hardware circuit as in claim 12, wherein the integrated circuit additionally includes comparator logic to control the emission logic during the LED emission pulse.

14. The display driver hardware circuit as in claim 13, wherein the comparator logic includes a transistor coupled between a data voltage and a ramp voltage.

15. The display driver hardware circuit as in claim 14, wherein the comparator logic is to end the LED emission pulse when the ramp voltage is within a threshold of the data voltage.

16. The display driver hardware circuit as in claim 12, wherein the ramp signal generator is in a row driver coupled to the display driver hardware circuit.

17. The display driver hardware circuit as in claim 12, wherein the ramp signal generator is in a timing control circuit coupled to the display driver hardware circuit.

18. A light emitting assembly comprising:
an array of light emitting diode (LED) devices;
a sample and hold circuit including a thin film transistor (TFT) of a TFT backplane;
a ramp signal generator; and
an array of microcontroller chips coupled with the TFT backplane, the array of microcontroller chips comprising an array of crystalline silicon integrated circuits to switch and drive the array of LED devices based on a voltage ramp caused by the ramp signal generator, the voltage ramp to determine a pulse length of an emission pulse to an LED device of the array of LED devices, wherein the emission pulse is adjustable from a continuous duty cycle to a non-continuous duty cycle.

19. The light emitting assembly as in claim 18, wherein a number of the microcontroller chips in the array of microcontroller chips is less than a number of LED devices in the array of LED devices and each microcontroller chip in the array of microcontroller chips is in electrical connection with a plurality of pixels to drive a plurality of LED devices in each pixel.

20. The light emitting assembly as in claim 18, wherein each LED device in the array of LED devices has a maximum lateral dimension of 1 to 100 μm.

21. The light emitting assembly as in claim 18, wherein at least one microcontroller chip in the array of microcontroller chips has maximum lateral dimension of 1 to 100 μm.

22. The light emitting assembly as in claim 21, wherein at least one microcontroller chip in the array of microcontroller chips has maximum lateral dimension of 50 μm.

23. The light emitting assembly as in claim 18, wherein the TFT is a low temperature poly-silicon (LTPS) transistor.

24. The light emitting assembly as in claim 18, wherein the TFT is an Indium Gallium Zinc Oxide (IGZO) transistor.

25. A display system comprising:
a thin film transistor (TFT) backplane including an active area;
a ramp signal generator;
an array of micro driver chips coupled to the TFT backplane in the active area;
an array of micro light emitting diode (LED) devices in the active area, the array of micro LED devices electrically connected to the array of micro driver chips, and each micro driver chip controls a plurality of pixels, wherein the array of micro driver chips comprises an array of crystalline silicon integrated circuits to switch and drive the array of micro LED devices; and
an emission controller to cause the array of micro driver chips to supply an emission pulse to the array of LED devices, wherein a length of the emission pulse is a function of an analog input data voltage and the emission pulse is adjustable from a continuous duty cycle to a non-continuous duty cycle.

26. The display system of claim 25, additionally comprising a row of column drivers including a plurality of column drivers and a column of row drivers including a plurality of row drivers.

27. The display system as in claim 25, wherein a length of the emission pulse is proportional to a value of the analog input data voltage.

28. The display system as in claim 25, wherein the backplane includes a low temperature poly-silicon (LTPS) transistor.

29. The display system as in claim 25, wherein the backplane includes an Indium Gallium Zinc Oxide (IGZO) transistor.

* * * * *